United States Patent
Noyes

(10) Patent No.: US 10,115,844 B2
(45) Date of Patent: Oct. 30, 2018

(54) ELECTRODES COMPRISING NANOSTRUCTURED CARBON

(71) Applicant: Seerstone LLC, Provo, UT (US)

(72) Inventor: Dallas B. Noyes, Provo, UT (US)

(73) Assignee: SEERSTONE LLC, Provo, UT (US)

( * ) Notice: Subject to any disclaimer, the term of this patent is extended or adjusted under 35 U.S.C. 154(b) by 52 days.

(21) Appl. No.: 14/775,928

(22) PCT Filed: Mar. 12, 2014

(86) PCT No.: PCT/US2014/025024
§ 371 (c)(1),
(2) Date: Sep. 14, 2015

(87) PCT Pub. No.: WO2014/151119
PCT Pub. Date: Sep. 25, 2014

(65) Prior Publication Data
US 2016/0027934 A1 Jan. 28, 2016

Related U.S. Application Data

(60) Provisional application No. 61/793,163, filed on Mar. 15, 2013.

(51) Int. Cl.
*H01L 31/0224* (2006.01)
*H01M 4/36* (2006.01)
(Continued)

(52) U.S. Cl.
CPC ...... *H01L 31/022425* (2013.01); *C01B 32/15* (2017.08); *C21C 5/5211* (2013.01);
(Continued)

(58) Field of Classification Search
CPC .......... H01G 11/36; H01G 4/008; H01G 4/01; H01G 11/86; C21C 5/5211; H05B 7/06;
(Continued)

(56) References Cited

U.S. PATENT DOCUMENTS 1,478,730 A 12/1923 Brownlee et al.
1,735,925 A 11/1929 Jaeger
(Continued)

FOREIGN PATENT DOCUMENTS

JP 2000072981 A 3/2000
JP 2002100787 A 4/2002
(Continued)

OTHER PUBLICATIONS

Cha, et al., Mechanical and Electrical properties of cross-linked carbon nanotubes, Carbon 2008; 46: 482-488.*
(Continued)

*Primary Examiner* — Daniel McCracken
(74) *Attorney, Agent, or Firm* — TraskBritt, P.C.

(57) ABSTRACT

An electrode includes a network of compressed interconnected nanostructured carbon particles such as carbon nanotubes. Some nanostructured carbon particles of the network are in electrical contact with adjacent nanostructured carbon particles. Electrodes may be used in various devices, such as capacitors, electric arc furnaces, batteries, etc. A method of producing an electrode includes confining a mass of nanostructured carbon particles and densifying the confined mass of nanostructured carbon particles to form a cohesive body with sufficient contacts between adjacent nanostructured carbon particles to provide an electrical path between at least two remote points of the cohesive body. The electrodes may be sintered to induce covalent bonding between the nanostructured carbon particles at contact points to further enhance the mechanical and electrical properties of the electrodes.

18 Claims, 9 Drawing Sheets

(51) Int. Cl.

| | |
|---|---|
| *H01M 4/583* | (2010.01) |
| *H05B 7/06* | (2006.01) |
| *H01G 11/36* | (2013.01) |
| *H01G 11/86* | (2013.01) |
| *C21C 5/52* | (2006.01) |
| *F27B 3/08* | (2006.01) |
| *F27B 21/00* | (2006.01) |
| *F27D 11/08* | (2006.01) |
| *H01G 9/052* | (2006.01) |
| *C01B 32/15* | (2017.01) |
| *H01L 49/02* | (2006.01) |
| *C22C 26/00* | (2006.01) |
| *H01M 4/62* | (2006.01) |
| *H01G 4/008* | (2006.01) |
| *B82Y 40/00* | (2011.01) |
| *H01B 1/04* | (2006.01) |

(52) U.S. Cl.
CPC ............ *F27B 3/085* (2013.01); *F27B 21/00* (2013.01); *F27D 11/08* (2013.01); *H01G 9/052* (2013.01); *H01G 11/36* (2013.01); *H01G 11/86* (2013.01); *H01M 4/366* (2013.01); *H01M 4/583* (2013.01); *H05B 7/06* (2013.01); *B82Y 40/00* (2013.01); *C22C 2026/002* (2013.01); *H01B 1/04* (2013.01); *H01G 4/008* (2013.01); *H01L 28/60* (2013.01); *H01M 4/625* (2013.01); *Y02E 60/13* (2013.01); *Y02P 10/216* (2015.11)

(58) Field of Classification Search
CPC ........ F27D 11/08; Y02E 60/13; H01M 4/625; H01M 4/366; H01M 4/583; H01L 28/60; H01L 31/022425; C22C 2026/002; Y02P 10/216; F27B 3/085; F27B 21/00
See application file for complete search history.

(56) References Cited

U.S. PATENT DOCUMENTS

| | | |
|---|---|---|
| 1,964,744 A | 7/1934 | Odell |
| 2,429,980 A | 11/1947 | Allinson |
| 2,440,424 A | 4/1948 | Wiegand et al. |
| 2,796,331 A | 6/1957 | Kauffman et al. |
| 3,172,774 A | 3/1965 | Diefendorf |
| 3,378,345 A | 4/1968 | Bourdeau et al. |
| 3,634,999 A | 1/1972 | Howard et al. |
| 4,126,000 A | 11/1978 | Funk |
| 4,602,477 A | 7/1986 | Lucadamo et al. |
| 4,663,230 A | 5/1987 | Tennent |
| 4,710,483 A | 12/1987 | Burk et al. |
| 4,727,207 A | 2/1988 | Paparizos et al. |
| 5,149,584 A | 9/1992 | Baker et al. |
| 5,173,920 A | 12/1992 | Bochsler et al. |
| 5,260,043 A | 11/1993 | Li et al. |
| 5,413,866 A | 5/1995 | Baker et al. |
| 5,456,897 A | 10/1995 | Moy et al. |
| 5,457,343 A | 10/1995 | Ajayan et al. |
| 5,531,424 A | 7/1996 | Whipp |
| 5,569,635 A | 10/1996 | Moy et al. |
| 5,572,544 A | 11/1996 | Mathur et al. |
| 5,578,543 A | 11/1996 | Tennent et al. |
| 5,589,152 A | 12/1996 | Tennent et al. |
| 5,641,466 A | 6/1997 | Ebbesen et al. |
| 5,648,056 A | 7/1997 | Tanaka |
| 5,650,370 A | 7/1997 | Tennent et al. |
| 5,691,054 A | 11/1997 | Tennent et al. |
| 5,707,916 A | 1/1998 | Snyder et al. |
| 5,726,116 A | 3/1998 | Moy et al. |
| 5,747,161 A | 5/1998 | Iijima |
| 5,780,101 A | 7/1998 | Nolan et al. |
| 5,877,110 A | 3/1999 | Snyder et al. |
| 5,965,267 A | 10/1999 | Nolan et al. |
| 5,997,832 A | 12/1999 | Lieber et al. |
| 6,099,965 A | 8/2000 | Tennent et al. |
| 6,159,892 A | 12/2000 | Moy et al. |
| 6,183,714 B1 | 2/2001 | Smalley et al. |
| 6,203,814 B1 | 3/2001 | Fisher et al. |
| 6,221,330 B1 | 4/2001 | Moy et al. |
| 6,232,706 B1 | 5/2001 | Dai et al. |
| 6,239,057 B1 | 5/2001 | Ichikawa et al. |
| 6,261,532 B1 | 7/2001 | Ono |
| 6,262,129 B1 | 7/2001 | Murray et al. |
| 6,294,144 B1 | 9/2001 | Moy et al. |
| 6,333,016 B1 | 12/2001 | Resasco et al. |
| 6,346,189 B1 | 2/2002 | Dai et al. |
| 6,361,861 B2 | 3/2002 | Gao |
| 6,375,917 B1 | 4/2002 | Mandeville et al. |
| 6,413,487 B1 | 7/2002 | Resasco et al. |
| 6,423,288 B2 | 7/2002 | Mandeville et al. |
| 6,426,442 B1 | 7/2002 | Ichikawa et al. |
| 6,465,813 B2 | 10/2002 | Ihm |
| 6,518,218 B1 | 2/2003 | Sun et al. |
| 6,596,101 B2 | 7/2003 | Weihs et al. |
| 6,645,455 B2 | 11/2003 | Margrave et al. |
| 6,683,783 B1 | 1/2004 | Smalley et al. |
| 6,686,311 B2 | 2/2004 | Sun et al. |
| 6,692,717 B1 | 2/2004 | Smalley et al. |
| 6,713,519 B2 | 3/2004 | Wang et al. |
| 6,749,827 B2 | 6/2004 | Smalley et al. |
| 6,761,870 B1 | 7/2004 | Smalley et al. |
| 6,790,425 B1 | 9/2004 | Smalley et al. |
| 6,800,369 B2 | 10/2004 | Gimzewski et al. |
| 6,827,918 B2 | 12/2004 | Margrave et al. |
| 6,827,919 B1 | 12/2004 | Moy et al. |
| 6,835,330 B2 | 12/2004 | Nishino et al. |
| 6,835,366 B1 | 12/2004 | Margrave et al. |
| 6,841,139 B2 | 1/2005 | Margrave et al. |
| 6,855,301 B1 | 2/2005 | Rich et al. |
| 6,875,412 B2 | 4/2005 | Margrave et al. |
| 6,890,986 B2 | 5/2005 | Pruett |
| 6,899,945 B2 | 5/2005 | Smalley et al. |
| 6,905,544 B2 | 6/2005 | Setoguchi et al. |
| 6,913,740 B2 | 7/2005 | Polverejan et al. |
| 6,913,789 B2 | 7/2005 | Smalley et al. |
| 6,916,434 B2 | 7/2005 | Nishino et al. |
| 6,919,064 B2 | 7/2005 | Resasco et al. |
| 6,936,233 B2 | 8/2005 | Smalley et al. |
| 6,949,237 B2 | 9/2005 | Smalley et al. |
| 6,955,800 B2 | 10/2005 | Resasco et al. |
| 6,960,389 B2 | 11/2005 | Tennent et al. |
| 6,962,685 B2 | 11/2005 | Sun |
| 6,979,709 B2 | 12/2005 | Smalley et al. |
| 6,986,876 B2 | 1/2006 | Smalley et al. |
| 6,998,358 B2 | 2/2006 | French et al. |
| 7,011,771 B2 | 3/2006 | Gao et al. |
| 7,041,620 B2 | 5/2006 | Smalley et al. |
| 7,045,108 B2 | 5/2006 | Jiang et al. |
| 7,048,999 B2 | 5/2006 | Smalley et al. |
| 7,052,668 B2 | 5/2006 | Smalley et al. |
| 7,067,098 B2 | 6/2006 | Colbert et al. |
| 7,071,406 B2 | 7/2006 | Smalley et al. |
| 7,074,379 B2 | 7/2006 | Moy et al. |
| 7,094,385 B2 | 8/2006 | Beguin et al. |
| 7,094,386 B2 | 8/2006 | Resasco et al. |
| 7,094,679 B1 | 8/2006 | Li et al. |
| 7,097,820 B2 | 8/2006 | Colbert et al. |
| 7,105,596 B2 | 9/2006 | Smalley et al. |
| 7,125,534 B1 | 10/2006 | Smalley et al. |
| 7,132,062 B1 | 11/2006 | Howard |
| 7,135,159 B2 | 11/2006 | Shaffer et al. |
| 7,135,160 B2 | 11/2006 | Yang et al. |
| 7,150,864 B1 | 12/2006 | Smalley et al. |
| 7,157,068 B2 | 1/2007 | Li et al. |
| 7,160,532 B2 | 1/2007 | Liu et al. |
| 7,169,329 B2 | 1/2007 | Wong et al. |
| 7,201,887 B2 | 4/2007 | Smalley et al. |
| 7,204,970 B2 | 4/2007 | Smalley et al. |
| 7,205,069 B2 | 4/2007 | Smalley et al. |
| 7,214,360 B2 | 5/2007 | Chen et al. |
| 7,250,148 B2 | 7/2007 | Yang et al. |

(56) References Cited

U.S. PATENT DOCUMENTS

| | | |
|---|---|---|
| 7,270,795 B2 | 9/2007 | Kawakami et al. |
| 7,291,318 B2 | 11/2007 | Sakurabayashi et al. |
| 7,338,648 B2 | 3/2008 | Harutyunyan et al. |
| 7,365,289 B2 | 4/2008 | Wilkes et al. |
| 7,374,793 B2 | 5/2008 | Furukawa et al. |
| 7,390,477 B2 | 6/2008 | Smalley et al. |
| 7,396,798 B2 | 7/2008 | Ma et al. |
| 7,408,186 B2 | 8/2008 | Merkulov et al. |
| 7,410,628 B2 | 8/2008 | Bening et al. |
| 7,413,723 B2 | 8/2008 | Niu et al. |
| 7,452,828 B2 | 11/2008 | Hirakata et al. |
| 7,459,137 B2 | 12/2008 | Tour et al. |
| 7,459,138 B2 | 12/2008 | Resasco et al. |
| 7,473,873 B2 | 1/2009 | Biris et al. |
| 7,510,695 B2 | 3/2009 | Smalley et al. |
| 7,527,780 B2 | 5/2009 | Margrave et al. |
| 7,563,427 B2 | 7/2009 | Wei et al. |
| 7,563,428 B2 | 7/2009 | Resasco et al. |
| 7,569,203 B2 | 8/2009 | Fridman et al. |
| 7,572,426 B2 | 8/2009 | Strano et al. |
| 7,585,483 B2 | 9/2009 | Edwin et al. |
| 7,601,322 B2 | 10/2009 | Huang |
| 7,611,579 B2 | 11/2009 | Lashmore et al. |
| 7,615,204 B2 | 11/2009 | Ajayan et al. |
| 7,618,599 B2 | 11/2009 | Kim et al. |
| 7,622,059 B2 | 11/2009 | Bordere et al. |
| 7,632,569 B2 | 12/2009 | Smalley et al. |
| 7,645,933 B2 | 1/2010 | Narkis et al. |
| 7,655,302 B2 | 2/2010 | Smalley et al. |
| 7,670,510 B2 | 3/2010 | Wong et al. |
| 7,700,065 B2 | 4/2010 | Fujioka et al. |
| 7,704,481 B2 | 4/2010 | Higashi et al. |
| 7,719,265 B2 | 5/2010 | Harutyunyan et al. |
| 7,731,930 B2 | 6/2010 | Taki et al. |
| 7,736,741 B2 | 6/2010 | Maruyama et al. |
| 7,740,825 B2 | 6/2010 | Tohji et al. |
| 7,749,477 B2 | 7/2010 | Jiang et al. |
| 7,754,182 B2 | 7/2010 | Jiang et al. |
| 7,772,447 B2 | 8/2010 | Iaccino et al. |
| 7,780,939 B2 | 8/2010 | Margrave et al. |
| 7,785,558 B2 | 8/2010 | Hikata |
| 7,790,228 B2 | 9/2010 | Suekane et al. |
| 7,794,690 B2 | 9/2010 | Abatzoglou et al. |
| 7,794,797 B2 | 9/2010 | Vasenkov |
| 7,799,246 B2 | 9/2010 | Bordere et al. |
| 7,811,542 B1 | 10/2010 | McElrath et al. |
| 7,824,648 B2 | 11/2010 | Jiang et al. |
| 7,837,968 B2 | 11/2010 | Chang et al. |
| 7,838,843 B2 | 11/2010 | Kawakami et al. |
| 7,842,271 B2 | 11/2010 | Petrik |
| 7,854,945 B2 | 12/2010 | Fischer et al. |
| 7,854,991 B2 | 12/2010 | Hata et al. |
| 7,858,648 B2 | 12/2010 | Bianco et al. |
| 7,871,591 B2 | 1/2011 | Harutyunyan et al. |
| 7,879,398 B2 | 2/2011 | Kim et al. |
| 7,883,995 B2 | 2/2011 | Mitchell et al. |
| 7,887,774 B2 | 2/2011 | Strano et al. |
| 7,888,543 B2 | 2/2011 | Iaccino et al. |
| 7,897,209 B2 | 3/2011 | Shibuya et al. |
| 7,901,654 B2 | 3/2011 | Harutyunyan |
| 7,906,095 B2 | 3/2011 | Kawabata |
| 7,923,403 B2 | 4/2011 | Ma et al. |
| 7,923,615 B2 | 4/2011 | Silvy et al. |
| 7,932,419 B2 | 4/2011 | Liu et al. |
| 7,947,245 B2 | 5/2011 | Tada et al. |
| 7,951,351 B2 | 5/2011 | Ma et al. |
| 7,964,174 B2 | 6/2011 | Dubin et al. |
| 7,981,396 B2 | 7/2011 | Harutyunyan |
| 7,988,861 B2 | 8/2011 | Pham-Huu et al. |
| 7,993,594 B2 | 8/2011 | Wei et al. |
| 8,012,447 B2 | 9/2011 | Harutyunyan et al. |
| 8,017,892 B2 | 9/2011 | Biris et al. |
| 8,038,908 B2 | 10/2011 | Hirai et al. |
| 8,114,518 B2 | 2/2012 | Hata et al. |
| 8,138,384 B2 | 3/2012 | Iaccino et al. |
| 8,173,096 B2 | 5/2012 | Chang et al. |
| 8,178,049 B2 | 5/2012 | Shiraki et al. |
| 8,226,902 B2 | 7/2012 | Jang et al. |
| 8,314,044 B2 | 11/2012 | Jangbarwala |
| 8,486,362 B2 | 7/2013 | Fugetsu |
| 8,679,444 B2 | 3/2014 | Noyes |
| 8,865,613 B2 | 10/2014 | Mordkovich et al. |
| 9,090,472 B2 | 7/2015 | Noyes |
| 9,221,685 B2 | 12/2015 | Noyes |
| 9,327,970 B2 | 5/2016 | Nakamura et al. |
| 2002/0054849 A1 | 5/2002 | Baker et al. |
| 2002/0102193 A1 | 8/2002 | Smalley et al. |
| 2002/0102196 A1 | 8/2002 | Smalley et al. |
| 2002/0127169 A1 | 9/2002 | Smalley et al. |
| 2002/0127170 A1 | 9/2002 | Hong et al. |
| 2002/0172767 A1 | 11/2002 | Grigorian et al. |
| 2002/0173420 A1 | 11/2002 | Cantrell et al. |
| 2003/0059364 A1 | 3/2003 | Prilutskiy |
| 2003/0147802 A1 | 8/2003 | Smalley et al. |
| 2004/0035355 A1 | 2/2004 | Avouris et al. |
| 2004/0053440 A1 | 3/2004 | Lai et al. |
| 2004/0070009 A1 | 4/2004 | Resasco et al. |
| 2004/0105807 A1 | 6/2004 | Fan et al. |
| 2004/0111968 A1 | 6/2004 | Day et al. |
| 2004/0150312 A1 | 8/2004 | McElrath et al. |
| 2004/0194705 A1 | 10/2004 | Dai et al. |
| 2004/0197260 A1 | 10/2004 | Resasco et al. |
| 2004/0202603 A1 | 10/2004 | Fischer et al. |
| 2004/0234445 A1 | 11/2004 | Serp et al. |
| 2004/0247503 A1 | 12/2004 | Hyeon |
| 2004/0265212 A1 | 12/2004 | Varadan et al. |
| 2005/0002850 A1 | 1/2005 | Niu et al. |
| 2005/0002851 A1 | 1/2005 | McElrath et al. |
| 2005/0025695 A1 | 2/2005 | Pradhan |
| 2005/0042162 A1 | 2/2005 | Resasco et al. |
| 2005/0046322 A1 | 3/2005 | Kim et al. |
| 2005/0079118 A1 | 4/2005 | Maruyama et al. |
| 2005/0100499 A1 | 5/2005 | Oya et al. |
| 2005/0176990 A1 | 8/2005 | Coleman et al. |
| 2005/0238810 A1 | 10/2005 | Scaringe et al. |
| 2005/0244325 A1 | 11/2005 | Nam et al. |
| 2005/0276743 A1 | 12/2005 | Lacombe et al. |
| 2006/0013757 A1 | 1/2006 | Edwin et al. |
| 2006/0045837 A1 | 3/2006 | Nishimura |
| 2006/0078489 A1 | 4/2006 | Harutyunyan et al. |
| 2006/0104884 A1 | 5/2006 | Shaffer et al. |
| 2006/0104886 A1 | 5/2006 | Wilson |
| 2006/0104887 A1 | 5/2006 | Fujioka et al. |
| 2006/0133990 A1 | 6/2006 | Hyeon et al. |
| 2006/0165988 A1 | 7/2006 | Chiang et al. |
| 2006/0166810 A1* | 7/2006 | Gunderman ............ B01D 61/20 502/64 |
| 2006/0191835 A1 | 8/2006 | Petrik et al. |
| 2006/0199770 A1 | 9/2006 | Bianco et al. |
| 2006/0204426 A1 | 9/2006 | Akins et al. |
| 2006/0239891 A1 | 10/2006 | Niu et al. |
| 2006/0245996 A1 | 11/2006 | Xie et al. |
| 2006/0275956 A1 | 12/2006 | Konesky |
| 2006/0286022 A1 | 12/2006 | Miyamoto et al. |
| 2007/0003470 A1 | 1/2007 | Smalley et al. |
| 2007/0020168 A1 | 1/2007 | Asmussen et al. |
| 2007/0031320 A1 | 2/2007 | Jiang et al. |
| 2007/0056855 A1* | 3/2007 | Lo ........................... C25D 3/38 205/76 |
| 2007/0116631 A1 | 5/2007 | Li et al. |
| 2007/0148962 A1 | 6/2007 | Kauppinen et al. |
| 2007/0149392 A1 | 6/2007 | Ku et al. |
| 2007/0172409 A1 | 7/2007 | Hikata |
| 2007/0183959 A1 | 8/2007 | Charlier et al. |
| 2007/0189953 A1 | 8/2007 | Bai et al. |
| 2007/0207318 A1 | 9/2007 | Jin et al. |
| 2007/0209093 A1 | 9/2007 | Tohji et al. |
| 2007/0253886 A1 | 11/2007 | Abatzoglou et al. |
| 2007/0264187 A1 | 11/2007 | Harutyunyan et al. |
| 2007/0280876 A1 | 12/2007 | Tour et al. |
| 2007/0281087 A1 | 12/2007 | Harutyunyan et al. |
| 2008/0003170 A1 | 1/2008 | Buchholz et al. |
| 2008/0003182 A1 | 1/2008 | Wilson et al. |
| 2008/0008760 A1 | 1/2008 | Bianco et al. |

(56) References Cited

U.S. PATENT DOCUMENTS

| | | |
|---|---|---|
| 2008/0014654 A1 | 1/2008 | Weisman et al. |
| 2008/0095695 A1 | 4/2008 | Shanov et al. |
| 2008/0118426 A1 | 5/2008 | Li et al. |
| 2008/0160312 A1 | 7/2008 | Furukawa et al. |
| 2008/0169061 A1 | 7/2008 | Tour et al. |
| 2008/0176069 A1 | 7/2008 | Ma et al. |
| 2008/0193367 A1 | 8/2008 | Kalck et al. |
| 2008/0217588 A1 | 9/2008 | Arnold et al. |
| 2008/0221227 A1 | 9/2008 | Christensen et al. |
| 2008/0226538 A1 | 9/2008 | Rumpf et al. |
| 2008/0233402 A1 | 9/2008 | Carlson et al. |
| 2008/0239620 A1 | 10/2008 | Min et al. |
| 2008/0260618 A1 | 10/2008 | Kawabata |
| 2008/0263954 A1 | 10/2008 | Hammel et al. |
| 2008/0274277 A1 | 11/2008 | Rashidi et al. |
| 2008/0279753 A1 | 11/2008 | Harutyunyan |
| 2008/0280136 A1 | 11/2008 | Zachariah et al. |
| 2008/0296537 A1 | 12/2008 | Gordon et al. |
| 2008/0299029 A1 | 12/2008 | Grosboll et al. |
| 2008/0305028 A1 | 12/2008 | McKeigue et al. |
| 2008/0305029 A1 | 12/2008 | McKeigue et al. |
| 2008/0305030 A1 | 12/2008 | McKeigue et al. |
| 2009/0001326 A1 | 1/2009 | Sato et al. |
| 2009/0004075 A1 | 1/2009 | Chung et al. |
| 2009/0011128 A1 | 1/2009 | Oshima et al. |
| 2009/0022652 A1 | 1/2009 | Sato et al. |
| 2009/0035569 A1 | 2/2009 | Gonzalez Moral et al. |
| 2009/0056802 A1 | 3/2009 | Rabani |
| 2009/0074634 A1 | 3/2009 | Tada et al. |
| 2009/0075157 A1 | 3/2009 | Pak et al. |
| 2009/0081454 A1 | 3/2009 | Axmann et al. |
| 2009/0087622 A1 | 4/2009 | Busnaina et al. |
| 2009/0124705 A1 | 5/2009 | Meyer et al. |
| 2009/0136413 A1 | 5/2009 | Li et al. |
| 2009/0140215 A1 | 6/2009 | Buchholz et al. |
| 2009/0176100 A1 | 7/2009 | Higashi et al. |
| 2009/0186223 A1 | 7/2009 | Saito et al. |
| 2009/0191352 A1 | 7/2009 | DuFaux et al. |
| 2009/0203519 A1 | 8/2009 | Abatzoglou et al. |
| 2009/0208388 A1 | 8/2009 | McKeigue et al. |
| 2009/0208708 A1 | 8/2009 | Wei et al. |
| 2009/0220392 A1 | 9/2009 | McKeigue et al. |
| 2009/0226704 A1 | 9/2009 | Kauppinen et al. |
| 2009/0257945 A1 | 10/2009 | Biris et al. |
| 2009/0286084 A1 | 11/2009 | Tennent et al. |
| 2009/0286675 A1 | 11/2009 | Wei et al. |
| 2009/0294753 A1 | 12/2009 | Hauge et al. |
| 2009/0297846 A1 | 12/2009 | Hata et al. |
| 2009/0297847 A1 | 12/2009 | Kim et al. |
| 2009/0301349 A1 | 12/2009 | Afzali-Ardakani et al. |
| 2010/0009204 A1 | 1/2010 | Noguchi et al. |
| 2010/0034725 A1 | 2/2010 | Harutyunyan |
| 2010/0047152 A1 | 2/2010 | Whelan et al. |
| 2010/0062229 A1 | 3/2010 | Hata et al. |
| 2010/0065776 A1 | 3/2010 | Han et al. |
| 2010/0074811 A1 | 3/2010 | McKeigue et al. |
| 2010/0081568 A1 | 4/2010 | Bedworth |
| 2010/0104808 A1 | 4/2010 | Fan et al. |
| 2010/0104849 A1 | 4/2010 | Lashmore et al. |
| 2010/0129654 A1 | 5/2010 | Jiang et al. |
| 2010/0132883 A1 | 6/2010 | Burke et al. |
| 2010/0158788 A1 | 6/2010 | Kim et al. |
| 2010/0159222 A1 | 6/2010 | Hata et al. |
| 2010/0160155 A1 | 6/2010 | Liang |
| 2010/0167053 A1 | 7/2010 | Sung et al. |
| 2010/0173037 A1 | 7/2010 | Jiang et al. |
| 2010/0173153 A1 | 7/2010 | Hata et al. |
| 2010/0196249 A1 | 8/2010 | Hata et al. |
| 2010/0209696 A1 | 8/2010 | Seals et al. |
| 2010/0213419 A1 | 8/2010 | Jiang et al. |
| 2010/0221173 A1 | 9/2010 | Tennent et al. |
| 2010/0222432 A1 | 9/2010 | Hua |
| 2010/0226848 A1 | 9/2010 | Nakayama et al. |
| 2010/0230642 A1 | 9/2010 | Kim et al. |
| 2010/0258446 A1 | 10/2010 | Mohapatra et al. |
| 2010/0260927 A1 | 10/2010 | Gordon et al. |
| 2010/0278717 A1 | 11/2010 | Suzuki et al. |
| 2010/0298125 A1 | 11/2010 | Kim et al. |
| 2010/0303675 A1 | 12/2010 | Suekane et al. |
| 2010/0316562 A1 | 12/2010 | Carruthers et al. |
| 2010/0317790 A1 | 12/2010 | Jang et al. |
| 2010/0320437 A1 | 12/2010 | Gordon et al. |
| 2011/0008617 A1 | 1/2011 | Hata et al. |
| 2011/0014368 A1 | 1/2011 | Vasenkov |
| 2011/0020211 A1 | 1/2011 | Jayatissa |
| 2011/0024697 A1 | 2/2011 | Biris et al. |
| 2011/0027162 A1 | 2/2011 | Steiner, III et al. |
| 2011/0027163 A1 | 2/2011 | Shinohara et al. |
| 2011/0033367 A1 | 2/2011 | Riehl et al. |
| 2011/0039124 A1 | 2/2011 | Ikeuchi et al. |
| 2011/0053020 A1 | 3/2011 | Norton et al. |
| 2011/0053050 A1 | 3/2011 | Lim et al. |
| 2011/0060087 A1 | 3/2011 | Noguchi et al. |
| 2011/0085961 A1 | 4/2011 | Noda et al. |
| 2011/0110842 A1 | 5/2011 | Haddon |
| 2011/0120138 A1 | 5/2011 | Gaiffi et al. |
| 2011/0142745 A1 | 6/2011 | Feng et al. |
| 2011/0150746 A1 | 6/2011 | Khodadadi et al. |
| 2011/0155964 A1 | 6/2011 | Arnold et al. |
| 2011/0158892 A1 | 6/2011 | Yamaki |
| 2011/0171109 A1 | 7/2011 | Petrik |
| 2011/0174145 A1 | 7/2011 | Ogrin et al. |
| 2011/0206469 A1 | 8/2011 | Furuyama et al. |
| 2011/0212016 A1 | 9/2011 | Lee et al. |
| 2012/0080313 A1 | 4/2012 | Baumgart et al. |
| 2012/0083408 A1 | 4/2012 | Sato et al. |
| 2012/0107610 A1 | 5/2012 | Moravsky et al. |
| 2012/0137664 A1 | 6/2012 | Shawabkeh et al. |
| 2012/0148476 A1 | 6/2012 | Hata et al. |
| 2012/0149824 A1 | 6/2012 | Hocke et al. |
| 2012/0258371 A1 | 10/2012 | Nakanishi et al. |
| 2013/0315813 A1 | 11/2013 | Chang et al. |
| 2014/0021827 A1 | 1/2014 | Noyes |
| 2014/0086820 A1 | 3/2014 | Nakamura et al. |
| 2014/0141248 A1 | 5/2014 | Noyes |
| 2014/0348739 A1 | 11/2014 | Denton et al. |
| 2015/0059527 A1 | 3/2015 | Noyes |
| 2015/0059571 A1 | 3/2015 | Denton et al. |
| 2015/0064092 A1 | 3/2015 | Noyes |
| 2015/0064096 A1 | 3/2015 | Noyes |
| 2015/0064097 A1 | 3/2015 | Noyes |
| 2015/0071848 A1 | 3/2015 | Denton et al. |
| 2015/0078981 A1 | 3/2015 | Noyes |
| 2015/0086468 A1 | 3/2015 | Noyes |
| 2015/0093323 A1 | 4/2015 | Koveal, Jr. et al. |
| 2015/0114819 A1 | 4/2015 | Denton et al. |
| 2015/0147259 A1 | 5/2015 | Noyes |
| 2015/0147261 A1 | 5/2015 | Denton et al. |
| 2015/0225242 A1 | 8/2015 | Noyes |
| 2015/0291424 A1 | 10/2015 | Noyes |
| 2015/0321918 A1 | 11/2015 | Noyes |
| 2016/0016794 A1 | 1/2016 | Noyes |
| 2016/0016800 A1 | 1/2016 | Noyes |
| 2016/0016862 A1 | 1/2016 | Noyes |
| 2016/0023902 A1 | 1/2016 | Noyes |
| 2016/0027934 A1 | 1/2016 | Noyes |
| 2016/0030925 A1 | 2/2016 | Noyes |
| 2016/0030926 A1 | 2/2016 | Noyes |
| 2016/0031710 A1 | 2/2016 | Noyes et al. |
| 2016/0039677 A1 | 2/2016 | Noyes |
| 2016/0156051 A1 | 6/2016 | Chua et al. |

FOREIGN PATENT DOCUMENTS

| | | |
|---|---|---|
| JP | 3339339 B2 | 10/2002 |
| JP | 2004360099 A | 12/2004 |
| JP | 2005272277 A | 10/2005 |
| WO | 0230816 A1 | 4/2002 |
| WO | 03018474 A1 | 3/2003 |
| WO | 2005103348 A1 | 11/2005 |
| WO | 2006003482 A2 | 1/2006 |
| WO | 2006130150 A2 | 12/2006 |
| WO | 2007126412 A2 | 11/2007 |
| WO | 2009122139 A1 | 10/2009 |

(56) References Cited

FOREIGN PATENT DOCUMENTS

| WO | 2009145959 A1 | 12/2009 | | |
|---|---|---|---|---|
| WO | 2010087903 A1 | 8/2010 | | |
| WO | 2010/120581 | * | 10/2010 | D01F 9/00 |
| WO | WO 2010/120581 | * | 10/2010 | D01F 9/00 |
| WO | 2010146169 A2 | 12/2010 | | |
| WO | 2011009071 A1 | 1/2011 | | |
| WO | 2014/15119 A | 9/2014 | | |

OTHER PUBLICATIONS

"Carbon Nanotubes," accessed online at http://www.sigmaaldrich.com/materials-science/material-science-products.html?TablePage=16376687, available online on Nov. 25, 2010.*
Kukovitsky, et al., Correlation between metal catalyst particle size and carbon nanotube growth, Chemical Physics Letters 2002; 355: 497-503.*
Beguin, et al., A Self-Supporting Electrode for Supercapacitors Prepared by One-Step Pyrolysis of Carbon Nanotube/Polyacrylonitrile Blends, Adv. Mater. 2005; 17: 2380-2384.*
PCT International Written Opinion, PCT/US2014/025024, dated Sep. 29, 2014.
PCT International Preliminary Report on Patentability, PCT/US2014/025024, dated Sep. 29, 2014.
PCT International Search Report, PCT/US2014/025024, dated Sep. 29, 2014.
Abatzoglou, Nicolas et al., "The use of catalytic reforming reactions for C02 sequestration as carbon nanotubes," Proceedings of the 2006 IASME/WSEAS International Conference on Energy & Environmental Systems, Chalkida, Greece, May 8-10, 2006 (pp. 21-26) (available at: http://www.wseas.us/e-library/conferences/2006evia/papers/516-19 3.pdf).
Abatzoglou, Nicolas et al., "Green Diesel from Fischer-Tropsch Synthesis: Challenges and Hurdles," Proc. of the 3rd IASME/WSEAS Int. Conf. on Energy, Environment, Ecosystems and Sustainable Development, Agios Nikolaos, Greece, Jul. 24-26, 2007, pp. 223-232.
Baker, B. A. and G. D. Smith "Metal Dusting in a Laboratory Environment—Alloying Addition Effects," Special Metals Corporation, undated.
Baker, B. A. and G. D. Smith, "Alloy Solutions to Metal Dusting Problems in the PetroChemical Industry," Special Metals Corporation, undated.
Database WPI Week 198920 Thomson Scientific, London, GB; AN 1989-148422 XP002719593, & JP H01 92425 A (NIPPON KOKAN KK) Apr. 11, 1989 (Apr. 11, 1989).
Cha, S. I., et al., "Mechanical and electrical properties of cross-linked carbon nanotubes," Carbon 46 (2008)482-488, Elsevier, Ltd.
Cheng, H.M. et al., "Large-scale and low-cost synthesis of single-walled carbon nanotubes by the catalytic pyrolysis of hydrocarbons," Applied Physics Letters 72:3282-3284, Jun. 22, 1998 (available at: http://carbon.imr.ac.cn/file/journai/1998/98_APL_72_3282-ChengH M.pdf).
Chun, Changmin, and Ramanarayanan, Trikur A., "Metal Dusting Corrosion of Metals and Alloys," 2007.
Chung, U.C., and W.S. Chung, "Mechanism on Growth of Carbon Nanotubes Using CO—H2 Gas Mixture," Materials Science Forum vols. 475-479 (2005) pp. 3551-3554.
Dai, et al., "Single-wall nanotubes produced by metal-catalyzed disproportionation of carbon monoxide," Chemical Physics Letters 260 (1996) 471-475, Elsevier.
Dresselhaus et al., Carbon Nanotubes Synthesis, Structure, Properties, and Applications. 2001, pp. 1-9, Springer.
Garmirian, James Edwin, "Carbon Deposition in a Bosch Process Using a Cobalt and Nickel Catalyst," PhD Dissertation, Massachusetts Institute of Technology, Mar. 1980, pp. 14-185.
Grobert, Nicole, "Carbon nanotubes—becoming clean," Materials Today, vol. 10, No. 1-2, Jan.-Feb. 2007, Elsevier, pp. 28-35.
Hata, Kenji, "From Highly Efficient Impurity-Free CNT Synthesis to DWNT forests, CNTsolids and Super-Capacitors," unknown date, unknown publisher, Research Center for Advanced Carbon Materials, National Institute of Advanced Industrial Science and Technology (AIST), Tsukuba, 305-8565, Japan.
Hiraoka, Tatsuki, et al., "Synthesis of Single—and Double-Walled Carbon Nanotube Forests on Conducting Metal Foils," 9 J. AM. CHEM. SOC. 2006, 128, 13338-13339.
Holmes, et al.; A Carbon Dioxide Reduction Unit Using Bosch Reaction and Expendable Catalyst Cartridges; NASA; 1970; available at https://archive.org/details/nasa_techdoc_19710002858.
Huang, Z.P., et al., "Growth of highly oriented carbon nanotubes by plasma-enhanced hot filament chemical vapor deposition," Applied Physics Letters 73:3845-3847, Dec. 28, 1998.
"INCONEL® alloy 693—Excellent Resistance to Metal Dusting and High Temperature Corrosion" Special Metals Product Sheet, 2005.
Unknown author, "Metal Dusting," unknown publisher, undated.
Krestinin, A. V., et al. "Kinetics of Growth of Carbon Fibers on an Iron Catalyst in Methane Pyrolysis: A Measurement Procedure with the Use of an Optical Microscope," Kinetics and Catalysis, 2008, vol. 49, No. 1, pp. 68-78.
Lal, Archit, "Effect of Gas Composition and Carbon Activity on the Growth of Carbon Nanotubes," Masters Thesis, University of Florida, 2003.
Unknown author, "Metal Dusting of reducing gas furnace HK40 tube," unknown publisher, undated.
Manning, Michael Patrick, "An Investigation of the Bosch Process," PhD Dissertation, Massachusetts Institute of Technology, Jan. 1976.
Muller-Lorenz and Grabke, Coking by metal dusting of steels, 1999, Materials and Corrosion 50, 614-621 (1999).
SAE 820875 Utilization of Ruthenium and Ruthenium-Iron Alloys as Bosch Process Catalysts. Jul. 19-21, 1982.
SAE 911451 Optimization of Bosch Reaction, Jul. 15-18, 1991.
Nasibulin, Albert G., et al., "An essential role of C02 and H20 during single-walled CNT synthesis from carbon monoxide," Chemical Physics Letters 417 (2005) 179-184.
Nasibulin, Albert G., et al., "Correlation between catalyst particle and single-walled carbon nanotube diameters," Carbon 43 (2005) 2251-2257.
Noordin, Mohamad and Kong Yong Liew, "Synthesis of Alumina Nanofibers and Composites," in Nanofibers, pp. 405-418 (Ashok Kumar, ed., 2010) ISBN 978-953-7619-86-2 (available at http://www.intechopen.com/books/nanofibers/synthesis-of-alumina-nanofibers-and-composites).
Pender, Mark J., et al., "Molecular and polymeric precursors to boron carbide nanofibers, nanocylinders, and nanoporous ceramics," Pure Appl. Chem., vol. 75, No. 9, pp. 1287-1294, 2003.
Ruckenstein, E. and H.Y. Wang, "Carbon Deposition and Catalytic Deactivation during C02 Reforming of CH4 over Co/?-AI2O3 Catalysts," Journal of Catalysis, vol. 205, Issue 2, Jan. 25, 2002, pp. 289-293.
Sacco, Albert Jr., "An Investigation of the Reactions of Carbon Dioxide, Carbon Monoxide, Methane, Hydrogen, and Water over Iron, Iron Carbides, and Iron Oxides," PhD Dissertation, Massachusetts Institute of Technology, Jul. 1977, pp. 2, 15-234.
Skulason, Egill, Metallic and Semiconducting Properties of Carbon Nanotubes, Modem Physics, Nov. 2005, slide presentation, 21 slides, available at https://notendur.hi.is/egillsk/stuff/annad/Egiii.Slides2.pdf, last visited Apr. 28, 2014.
Songsasen, Apisit and Paranchai Pairgreethaves, "Preparation of Carbon Nanotubes by Nickel Catalyzed Decomposition of Liquefied Petroleum Gas (LPG)," Kasetsart J. (Nat. Sci.) 35 : 354-359 (2001) (available at: http://kaselsartjournal.ku.ac.th/kuj_files/2008/A0804251023348734.pdf).
Szakalos, P., "Mechanisms and driving forces of metal dusting," Materials and Corrosion, 2003, 54, No. 10, pp. 752-762.
Tsai, Heng-Yi, et al., "A feasibility study of preparing carbon nanotubes by using a metal dusting process," Diamond & Related Materials 18 (2009) 324-327, Elsevier.
Wilson, Richard B., "Fundamental Investigation of the Bosch Reaction" PhD Dissertation, Massachusetts Institute of Technology, Jul. 1977, pp. 12,23, 37, 43, 44, 62, 70, 80, 83-88, 98.

(56) References Cited

OTHER PUBLICATIONS

Wei, et al. "The mass production of carbon nanotubes using a nano-agglomerate fluidized bed reactor. A multiscale space-time analysis," Powder Technology 183 (2008) 10-20, Elsevier.
Zeng, Z., and Natesan, K., Relationship between the Growth of Carbon Nanofilaments and Metal Dusting Corrosion, 2005, Chem. Mater. 2005, 17, 3794-3801.
Camilli et al., The synthesis and characterization of carbon nanotubes grown by chemical vapor deposition using a stainless steel catalyst, Carbon, 2011, pp. 3307-3315, vol. 49, No. 10.
Wiegand et al., Fabrication of High Strength Metal-Carbon Nanotube Composites, U.S. Army Research and Development, Picatinny, New Jersey, and New Jersey Institute of Technology, Newark, New Jersey, report date Dec. 2008, 6 pages.

\* cited by examiner

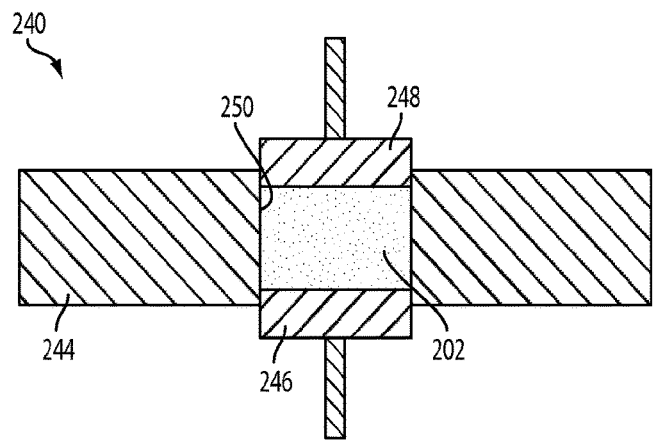
FIG. 7
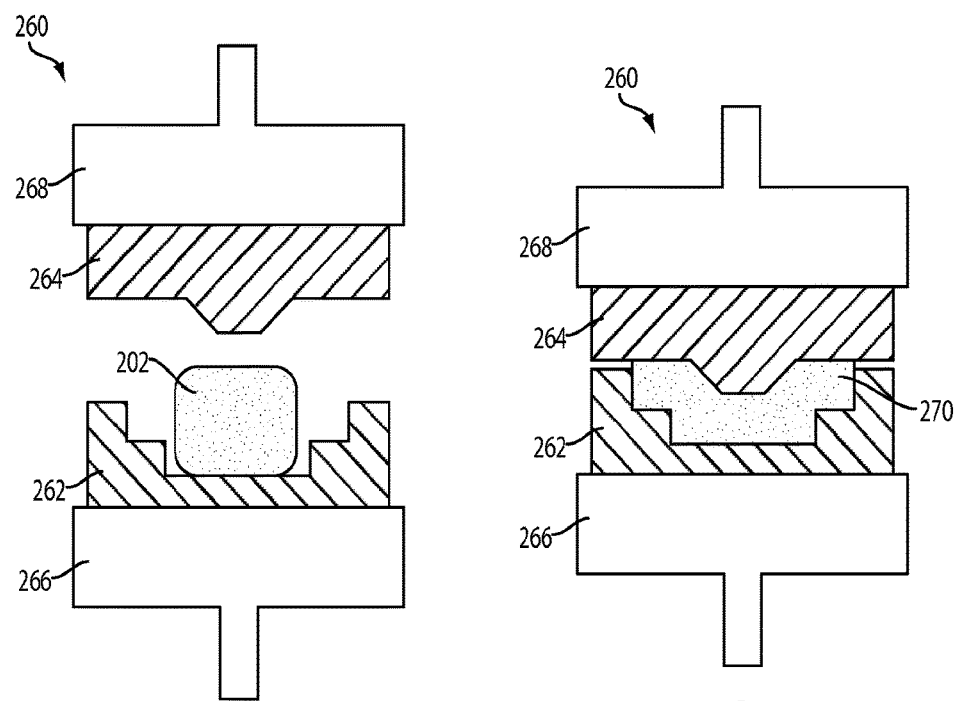
FIG. 8
FIG. 9

ELECTRODES COMPRISING NANOSTRUCTURED CARBON

PRIORITY CLAIM

This application claims the benefit of the filing date of U.S. Provisional Patent Application Ser. No. 61/793,163, filed Mar. 15, 2013, for "Electrodes Comprising Carbon Nanotubes" the contents of which are incorporated herein by this reference.

FIELD

Embodiments of the present disclosure relate to electrical contacts, such as electrodes, wires, etc.

BACKGROUND

U.S. Patent Publication No. 2012/0034150 A1, published Feb. 9, 2012, and titled "Method for Producing Solid Carbon by Reducing Carbon Oxides" discloses background information hereto. The subject matter of this application also relates to the subject matter of U.S. Patent Publication 2014/0021827 A1, published Jan. 23, 2014, titled "Primary Voltaic Sources Including Nanofiber Schottky Barrier Arrays and Methods of Forming Same;" and the subject matter of International Patent Publication WO 2014/011631, published Jan. 16, 2014, titled "Solid Carbon Products Comprising Carbon Nanotubes and Methods of Forming Same." The disclosures of each of these references are hereby incorporated herein in their entirety by this reference.

Powder metallurgy is the process of making a solid object out of one or more powdered materials. Specific techniques for working with various materials include manufacturing the powder, blending the powder to get the desired bulk composition, compressing the powder into a solid object, and in some cases sintering the solid object to further consolidate and change the properties of the solid object. Powder metallurgy is used on a wide variety of materials.

Solid carbon has a wide variety of allotropes and morphologies. Of particular interest are the nanostructured carbons, which include buckminsterfullerenes, carbon nanotubes (e.g., single-wall carbon nanotubes, multi-walled carbon nanotubes), nanodiamonds, graphene, nanofibers, amorphous carbons (both sp2- and sp3-bonded) and others known to the art. Many nanostructured carbon materials are extremely valuable, because of their unique physical and chemical properties. For example, various nanostructured materials are among the strongest, most thermally conductive, electrically conductive, corrosion resistant, abrasion resistant, and/or heat resistant, materials known. When used as additives, even small amounts of nanostructured carbon can significantly improve the performance of materials. Because of their high cost of production, however, nanostructured carbon is generally compounded as an additive with other substances.

Electrical conductors, such as wires and electrodes, are ubiquitous as components of various consumer products, industrial equipment, etc. Electrical conductors are commonly formed of metals, such as copper, aluminum, gold, platinum, steel, etc. The electrical conductivity of a material measures the material's ability to conduct an electrical current. Materials having relatively higher electrical conductivities may be well suited to carrying large currents, because such high-conductivity materials are less susceptible to heating than materials having relatively lower electrical conductivities.

Design of industrial and consumer products often requires balancing a number of considerations, including electrical properties, physical properties, material costs, and manufacturing concerns. In the semiconductor industry, components are typically designed to be compact, reliable, and energy-efficient, with low manufacturing costs. Electrical conductors in such applications may be formed of low-cost materials having high electrical conductivity and adequate physical strength. Industrial equipment, on the other hand, may be designed with different objectives; for example, compactness may be less important than reliability.

Electrodes in electric arc furnaces endure harsh chemical, mechanical, thermal and electrical conditions. Many methods have been employed to develop electrode materials that are suitable for these service conditions. Electrodes for electric arc furnaces are currently formed as artificial graphite in a multi-step process that includes mixing a high purity carbon (pet coke, needle coke, etc.) with a hydrocarbon binder (e.g., a tar), extruding the electrode as a green form, pyrolizing the green form to pyrolize the tar and hydrocarbons in the electrode, and then sintering the electrode. The steps are energy- and time-intensive.

Carbon nanotubes are known to have high electrical conductivity. Carbon nanotube aggregates are described in U.S. Pat. No. 7,740,825, issued Jun. 22, 2010, and titled "Method of Forming a Carbon Nanotube Aggregate." Unpurified multilayer carbon nanotubes are fired and oxidized, then washed to remove amorphous carbon and catalytic metal. The washing process uses acid, base, and water in sequence. The purified carbon nanotubes are treated with fluorine to form C—F bonds in the carbon nanotubes. The fluorinated carbon nanotubes are pressed, sintered, and deaerated to bind the carbon nanotubes together and to remove the fluorine. Chemical bonding occurs between at least some of the carbon nanotubes at their contact points with adjacent carbon nanotubes. No binder or resin is used.

Carbon nanotubes are known to form solid masses, without fluorination or sintering as described in U.S. Pat. No. 6,899,945, issued May 31, 2005, and titled "Entangled single-wall carbon nanotube solid material and methods for making same;" and in U.S. Pat. No. 7,288,238, issued Oct. 30, 2007, and titled "Single-wall carbon nanotube alewives, process for making, and compositions thereof." It would be desirable to be able to form solid masses with high mechanical integrity suitable for applications such as electrodes for electric arc furnaces.

It would be beneficial to provide solid carbon objects with the properties of nanostructured carbon materials, particularly solid carbon electrical conductors with improved electrical and physical properties, that are relatively inexpensive, and that may be easily manufactured.

DISCLOSURE

This disclosure describes solid carbon objects, and methods of producing the same, having a network of compressed or densified interconnected nanostructured carbon (e.g., carbon nanotubes, carbon nanofibers, graphene, nanodiamonds, etc.) formed by compressing or extruding nanostructured carbon powder to form a green object. The resulting green object can be sintered to form covalent bonds between at least some of the carbon nanostructures at their points of contact and to further modify the physical properties of the sintered object. Compression of the powder can be done through a variety of standard techniques used in powder metallurgy and ceramics processes such as die pressing, extruding, injection molding, etc. In some embodiments, the solid carbon objects are sintered in inert high temperature (e.g., 1000 to 3000° C.) kilns, or using other suitable methods such as spark plasma sintering (SPS). The resulting solid carbon objects form an electrically conductive structure and provide an electrical path between at least two points of the electrode.

In some embodiments, the nanostructured carbon powder is made into a paste or clay, which is then molded or formed into a green object. The green object may be cured in one or more steps, whereupon the green object is placed in an inert kiln or heating apparatus and heated to a temperature at which the green object is sintered to form covalent bonds between at least some of the carbon nanostructures at their points of contact and to further modify the physical properties of the sintered object. Many different agents can be mixed with the nanostructured carbon powder, for example ethanol, water, resins, plastics, tars and pitches to form the paste or clay. For example, in one embodiment, the nanostructured carbon powder is first wetted with ethanol and subsequently mixed with water to form the paste or clay to be extruded into a green object. The green object is then dried in a low-temperature oven to evaporate the ethanol and water to desired levels. The green object is subsequently sintered to promote covalent bonding between at least some of the carbon nanostructures and form the sintered object.

In another embodiment, the nanostructured carbon powder is first wetted with ethanol and subsequently mixed with a sugar solution to form a paste or clay, which is extruded into a green object. The green object is then dried in a low-temperature oven to evaporate the ethanol and water to desired levels, and subsequently heated to pyrolize the sugar. The object is further heated to sintering temperatures to achieve the covalent bonding between at least some of the carbon nanostructures and form the sintered object. In this case, the sugar in the water acts as a carbon source. Upon pyrolysis, the carbon atoms become available to participate in the covalent bonding between at least some of the carbon nanostructures and build up stronger linkages. Some of the carbon atoms from the pyrolized sugar may also be beneficial in filling in defect sites in the carbon lattice of the carbon nanostructure, further improving electrical and physical properties.

In yet another embodiment, nanostructured carbon powder is mixed with a binder (e.g., an epoxy, a thermoset resin, polyacrylonitrile (PAN) or a tar or pitch) to form paste or clay. The paste or clay is then extruded into a green object. The green object is then cured in a low-temperature oven to cure the binder. The green object is subsequently heated to pyrolize the binder and then further heated to sintering temperatures to promote covalent bonding between at least some of the carbon nanostructures and form the sintered object. As the binder is pyrolized, at least some of the carbon atoms become available to act as described above in the case of sugar pyrolysis.

Sintered objects including nanostructured carbon may be useful in a wide variety of applications where electrical properties are important, including as for example, electrical conductors (e.g., wires), and as electrodes for electric arc furnaces, batteries, capacitors, and nuclear batteries. Sintered objects may also be useful in many other applications wherein their high specific surface area is valuable, including as for example, filters, heat sinks, catalytic converters, and molecular sieves. Sintered objects may further be useful in applications in which their thermal and other mechanical properties are valuable, including as for example, structural components, piping, conduits, chemical processing apparatus, and armor.

The disclosure also describes a capacitor having a first electrode comprising a first network of compressed interconnected carbon nanotubes, a second electrode comprising a second network of compressed interconnected carbon nanotubes, and a dielectric material disposed between the first electrode and the second electrode. Each of the electrodes is formed by applying a force to a plurality of raw carbon nanotubes to form a cohesive body. Carbon nanotubes of the first network and the second network are interconnected with adjacent carbon nanotubes to form an electrically conductive structure.

An electric arc furnace has a vessel, a first electrode, and a second electrode. The vessel includes an insulating material formulated to resist the flow of thermal and electrical energy. At least one of the first electrode and the second electrode comprises a network of compressed interconnected carbon nanotubes formed by applying a force to a plurality of raw carbon nanotubes to form a cohesive body. Carbon nanotubes of the network are in electrical contact adjacent carbon nanotubes. A first portion of each of the first electrode and the second electrode is disposed within the vessel and a second portion of each of the first electrode and the second electrode is disposed outside the vessel.

A battery includes a plurality of electrodes. Each electrode includes a network of compressed interconnected carbon nanotubes formed by applying a force to a plurality of raw carbon nanotubes to form a cohesive body. Carbon nanotubes of the network are in electrical contact with adjacent carbon nanotubes.

A method of producing an electrode includes disposing a plurality of raw carbon nanotubes in a press and applying a force to the press to compress the carbon nanotubes to form a cohesive body comprising carbon nanotubes. Electrical contacts are formed between adjacent carbon nanotubes of the cohesive body to provide an electrical path between at least two points on opposite surfaces of the electrode.

BRIEF DESCRIPTION OF THE DRAWINGS

FIGS. 5 through 9 are simplified cross-sectional views of presses for forming solid carbon products;

MODE(S) FOR CARRYING OUT THE INVENTION

Figure 1:
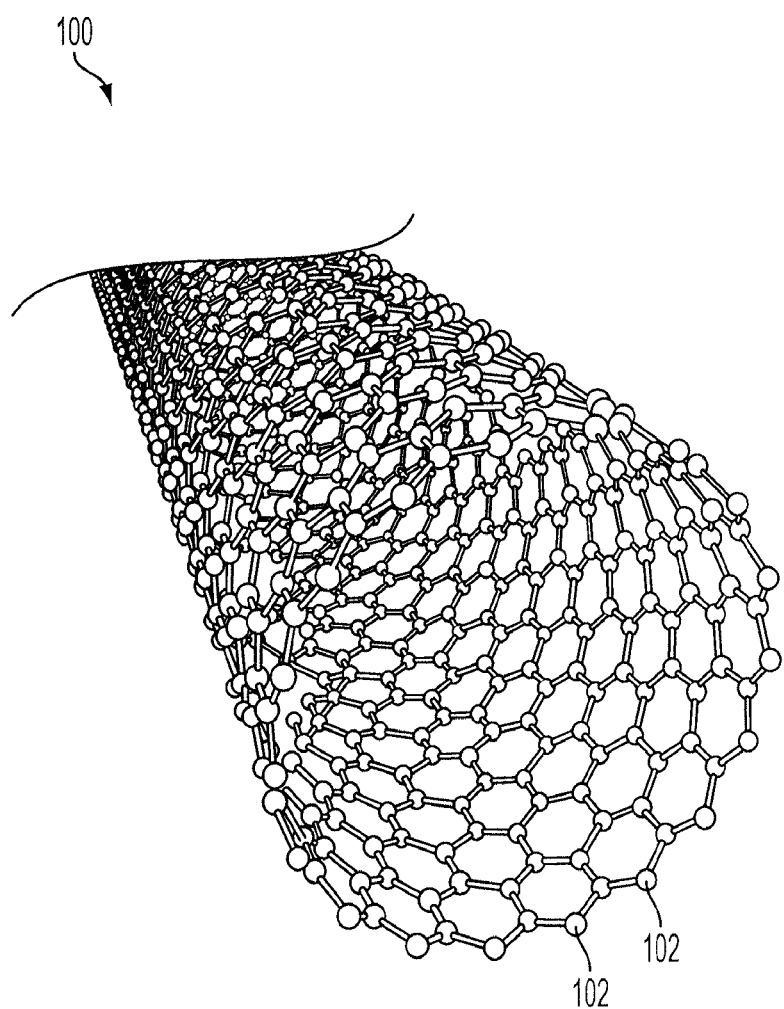
FIGS. 1 through 4 are simplified illustrations of carbon nanotubes.

Solid carbon objects comprised of nanostructured carbon, specifically including carbon nanotubes, as disclosed herein, include networks of interconnected nanostructured carbon particles useful as electrodes and other electrical conductors. Such solid carbon objects may be used in various devices and processes, such as structural shapes, pipes, wires, capacitors, batteries, electrical transmission conduits, electric furnaces, etc. The solid carbon objects are composed of sintered nanostructured carbon (e.g., carbon nanotubes, nanodiamonds, carbon nanofibers, graphene, etc.) that may be formed into a wide variety of useful shapes and objects. Solid carbon objects that are useful as electrical conductors are typically made of at least a portion of highly electrically conductive nanostructured carbon species, such as carbon nanotubes, metallic-chirality single-wall carbon nanotubes and graphene. In this disclosure, carbon nanotubes are used to illustrate the principles, however, it should be kept in mind that various combinations of nanostructured carbon materials may be used to good effect and this disclosure should be understood in light of the general application of nanostructured carbon in the production of sintered objects for electrical applications.

In some embodiments, a solid carbon object comprised of nanostructured carbon may be formed by compressing or otherwise densifying the nanostructured carbon to form contacts between a plurality of adjacent nanostructures, followed by sintering the densified material. In certain embodiments, a sintering step may include forming one or more covalent bonds between the adjacent carbon nanostructures at the contact points. This chemical bonding imparts enhanced physical properties to the resulting solid carbon objects, including unusual strength, thermal conductivity, and electrical conductivity, as compared to the material prior to sintering.

As used herein, the term "nanostructured carbon" means a particle or plurality of particles of substantially pure carbon with at least one characteristic dimension of between 1 nanometer and 1 micrometer. Nanostructured carbon includes buckminsterfullerenes, carbon nanotubes (e.g., single-wall carbon nanotubes, multi-walled carbon nanotubes), nanodiamonds, graphene, nanofibers, amorphous carbons (both sp2- and sp3-bonded) and others known in the art.

As used herein, the term "carbon nanotube" or "CNT" means and includes material having carbon atoms arranged into a hollow structure (e.g., a cylindrical structure) with a length greater than a radial diameter. CNTs may be of many different morphologies including multi-wall CNTs, few-wall CNTs or single wall CNTs depending on the number of layers in the walls of the tubes. Carbon nanotubes are members of the fullerene structural family.

As used herein, the term "raw" means and includes a material that has not been exposed to a chemical functionalization or modification. Raw nanostructured carbon may have been processed to remove residual materials (e.g., catalysts), but have not undergone treatment to chemically or physically bond the carbon atoms to one another (e.g., C—C covalent bonding), or to other moieties, such as fluorine.

As used herein, the terms "paste" and "clay" mean and include a mixture of raw nanostructured carbon and at least one fluid with the mixture thoroughly mixed to a homogeneous or near homogeneous state. Such mixtures include any fluid or liquid binder that may be desirable to improve the handling and forming of the nanostructured carbon into green objects. The fluid may include one or more carbon-containing molecules or constituents. Upon pyrolysis or carbonization, at least some carbon atoms of the carbon containing molecules or constituents may participate in covalent bonding to or between the nanostructured carbon comprising the sintered object. The paste or clay may be prepared in a wide range of viscosities from a pourable liquid to a very viscous mass.

As used herein, the term "green" or "green object" means and includes any object containing nanostructured carbon that has not been sintered. Green objects include both objects formed of raw nanostructured carbon or pastes or clays containing nanostructured carbon. Green objects are not generally final articles of manufacture, but rather are found in intermediate processing steps as the nanostructured carbon is transformed into a sintered object.

As used herein, the term "sintered object" means an article of manufacture consisting of a mass of multiple nanostructured carbon particles wherein at least some of the nanostructured carbon particles comprising the mass have covalent chemical bonds to adjacent nanostructured carbon particles.

As used herein, the term "sintering" means and includes annealing of nanostructured carbon at temperatures and pressures sufficient to induce chemical or physical bonding, whereby an integral electrically conductive structure is formed between two more adjacent nanostructured carbon. For example, nanostructured carbon may form carbon-carbon covalent bonds. Bonding occurs between at least some of the adjacent nanostructured carbon between at least some of their contact points.

As used herein, the term "catalyst residual" means and includes any non-carbon elements associated with the nanostructured carbon. Such non-carbon elements may include a nanoparticle of a metal catalyst in a growth tip of the nanostructured carbon, and metal atoms or groups of non-carbon atoms randomly or otherwise distributed throughout and on the surfaces of the nanostructured carbon.

CNTs may be created through any method known to the art, including arc discharge, laser ablation, hydrocarbon pyrolysis, the Boudouard reaction, the Bosch reaction and related carbon oxide reduction reactions, and wet chemistry methods (e.g., the Diels-Alder reaction). For example, U.S. Patent Application Publication 2012/0034150 A1 describes the catalytic conversion of carbon oxides to solid carbon products, including carbon nanotubes. The methods described herein are applicable to CNTs, regardless of the method of manufacture or synthesis. In some embodiments, CNTs are used in the methods described herein without subsequent purification or functionalization. For example, nanotubes formed by the Bosch reaction ($CO_2 + 2\ H_2 \leftrightarrow C_{(s)} + 2\ H_2O$) may be compressed without removing catalyst material from growth tips in the CNTs, and without providing reactive ligands on the CNTs. In other embodiments, catalyst material may be removed from CNTs before compression, and the CNTs used may be substantially free of elements other than carbon.

CNTs occur as single-wall and multi-wall carbon nanotubes of various diameters ranging from a few nanometers to 100 nanometers in diameter or more. CNTs have a wide variety of lengths and morphologies, and may occur, for example, as substantially parallel "forests," randomly tangled masses, or "pillows" of structured agglomerations. CNTs may also form or be compounded to form mixtures of CNTs with various combinations and distributions of the above characteristics (number of walls, diameters, lengths, morphology, orientation, etc.). Various mixtures, when compounded and used to form the solid carbon products described herein, may result in products with specifically engineered properties. For example, the median void size of interstitial spaces between CNTs in sintered objects typically is approximately proportional to the characteristic diameters of the CNTs used in forming the sintered objects. The median void size influences the overall porosity and density of the sintered objects.

Various CNT features and configurations are illustrated in FIGS. 1 through 4. FIG. 1 shows a single-wall CNT 100, in which carbon atoms 102 are linked together in the shape of a single cylinder. The carbon atoms 102 are covalently bonded into a hexagonal lattice, and thus form a CNT 100 that appears as a single graphitic layer rolled into the form of a tube. The CNT 100 may be conceptualized as a rolled graphene sheet having a lattice pattern oriented so that the carbon atoms 102 spiral at various angles with regard to the axis of the CNT 100. The angle is called the "chirality" and common named forms include armchair and zigzag, as described in Mildred S. Dresselhaus & Phaedon Avouris, *Introduction to Carbon Materials Research*, in *CARBON NANOTUBES: SYNTHESIS, STRUCTURE, PROPERTIES, AND APPLICATIONS*, 1, 6 (Mildred S. Dresselhaus et al., eds., 2001). Many chiralities are possible; CNTs 100 with different chiralities may exhibit different properties (e.g., CNTs 100 may have either semiconductor or metallic electrical properties). CNTs 100 having a mirror plane of symmetry are considered achiral (i.e., such CNTs 100 have no chirality). CNTs 100 without a mirror plane of symmetry are considered chiral.

A CNT 100 has an inside diameter related to the number of carbon atoms 102 in a circumferential cross section. The CNT 100 depicted in FIG. 1 has a zigzag pattern, as shown at the end of the CNT 100. The diameter may also affect properties of the CNT 100. Single-walled CNTs 100 can have many different diameters, such as from approximately 1.0 nm (nanometer) to 10 nm or more. A CNT 100 may have a length from about 10 nm to about 1 μm (micron), such as from about 20 nm to about 500 nm or from about 50 nm to about 100 nm. CNTs 100 typically have an aspect ratio (i.e., a ratio of the length of the CNT to the diameter of the CNT) of about 100:1 to 1000:1 or greater.

Figure 2:
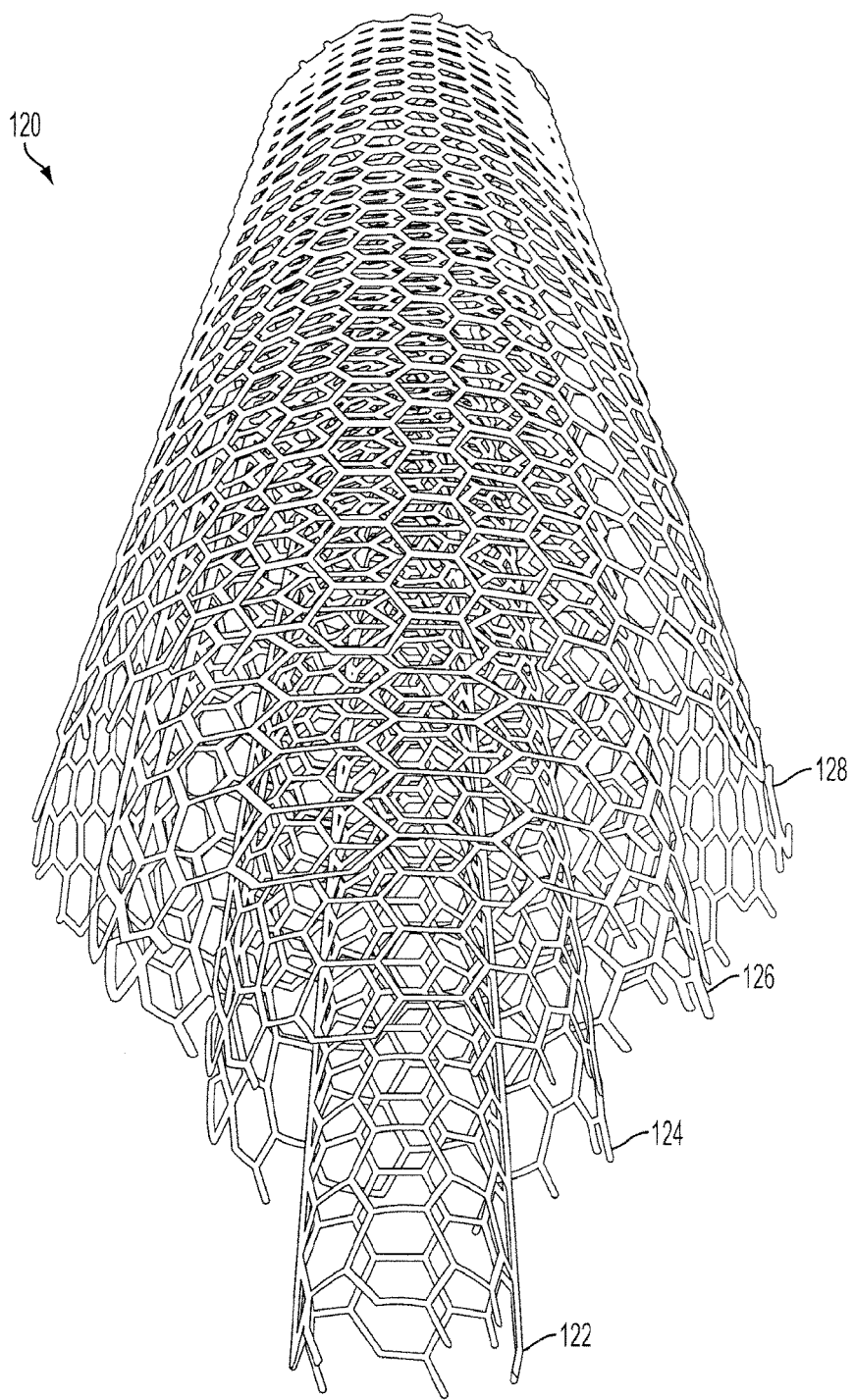

CNTs having more than one wall are called multi-wall CNTs. FIG. 2 schematically depicts a multi-wall CNT 120 having multiple graphitic layers 122, 124, 126, 128 arranged generally concentrically about a common axis. Double-walled and triple-walled carbon nanotubes are occasionally described as distinct classes; however, they may also be considered as categories of multi-walled CNTs 120. Diameters of multi-wall CNTs 120 can range from approximately 3 nm to well over 100 nm. Multi-wall CNTs 120 having outside diameters of about 40 nm or more are sometimes referred to as carbon nanofibers in the art.

Figure 3:
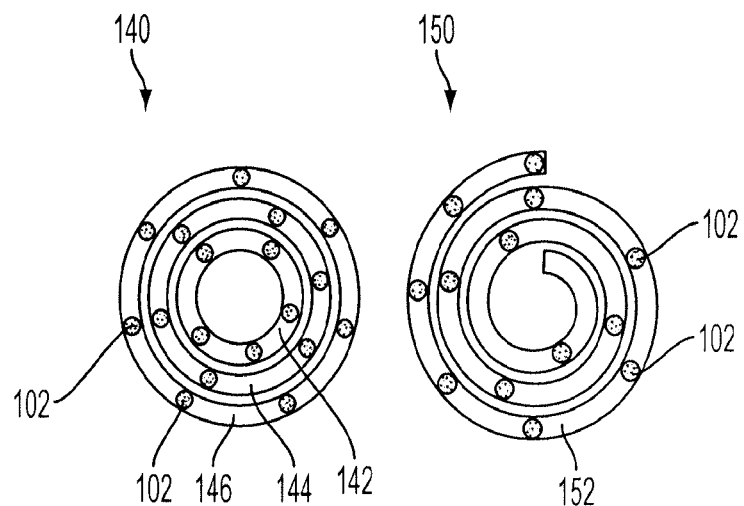

FIG. 3 shows simplified schematic cross-sections of two forms of multi-wall CNTs 140, 150. In the CNT 140, one single-wall CNT 142 is held within a larger diameter single-wall CNT 144, which is in turn held within another even larger diameter single-wall CNT 146. This CNT 140 is similar to the CNT 120 shown in FIG. 2, but includes three single-wall CNTs 142, 144, 146 instead of four. Another form of multi-wall CNT 150 may be conceptualized as a single graphene sheet 152 rolled into a spiral.

Figure 4:
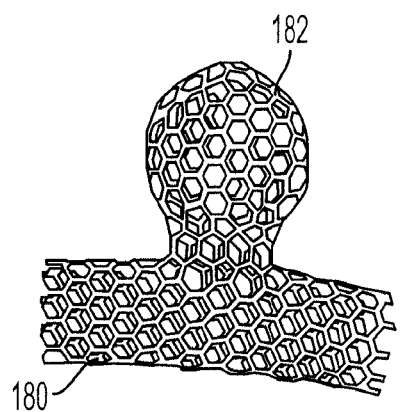

FIG. 4 schematically depicts a single-wall CNT 180 with an attached nanobud 182. The nanobud 182 has a structure similar to a spherical buckminsterfullerene ("buckyball"), and is bonded to the single-wall CNT 180 by carbon-carbon bonds. As suggested by the structure shown in FIG. 4, modifications may be made to the wall of a single-wall CNT 180 or to the outer wall of a multi-wall CNT. At the point of bonding between the nanobud 182 and the CNT 180, carbon double bonds can break and result in "holes" in the wall of the CNT 180.

Defect sites, such as the holes described in conjunction with the description of FIG. 4 above, may occur through many different mechanisms. The presence of defect sites may affect the mechanical and electrical properties of the nanostructured carbon. In single-wall CNTs, these defect sites may introduce a relative weakness when compared with unmodified cylindrical CNTs. In multi-wall CNTs, the outer wall may be affected by such defects, but inner walls may remain intact.

Nanostructured carbon often has at least some catalyst residual which in at least some embodiments may be removed prior to processing. For example, CNTs are typically formed in such a way that a nanoparticle of catalyst is embedded in the growth tip of the CNT. This catalyst may be left in place or removed by mild washing (e.g., by an acid wash) or oxidation followed by mild washing (e.g., by an acid wash) or any of the other techniques known in the art. Without being bound to a particular theory, it is believed that if the catalyst is left in place, catalyst atoms become mobilized during the sintering process, and may migrate to the surface or within the pores of the carbon nanotubes. This process may disperse the catalyst atoms randomly, uniformly, or otherwise throughout the sintered object mass and may have a significant influence on the properties of the sintered object. For example, catalyst material may affect electrical conductivity or the ability to catalyze other chemical reactions.

Nanostructured carbon, including CNTs, may be used in the processes herein may be used in raw form, without functionalization or other preparation. The nanostructured carbon may form chemical or physical bonds during sintering without the aid of a functionalizing compound or ligand. In some embodiments, the CNTs are unfluorinated.

The CNTs used in the processes herein may be single-wall CNTs, multi-wall CNTs, or combinations thereof, including bi-modally sized combinations of CNTs, mixtures of single-wall and multi-wall CNTs, mixtures of various sizes of single-wall CNTs, mixtures of various sizes of multi-wall CNTs, etc.

The nanostructured carbon pastes and clays may be in forms such as a sheet-molded compound, a pressure-molded compound, or a pourable liquid. The CNTs may be disposed within a press or any other device structured and configured to provide pressure to the material. The press or other device may include an extrusion die, a mold, a cavity, etc.

Figure 5:
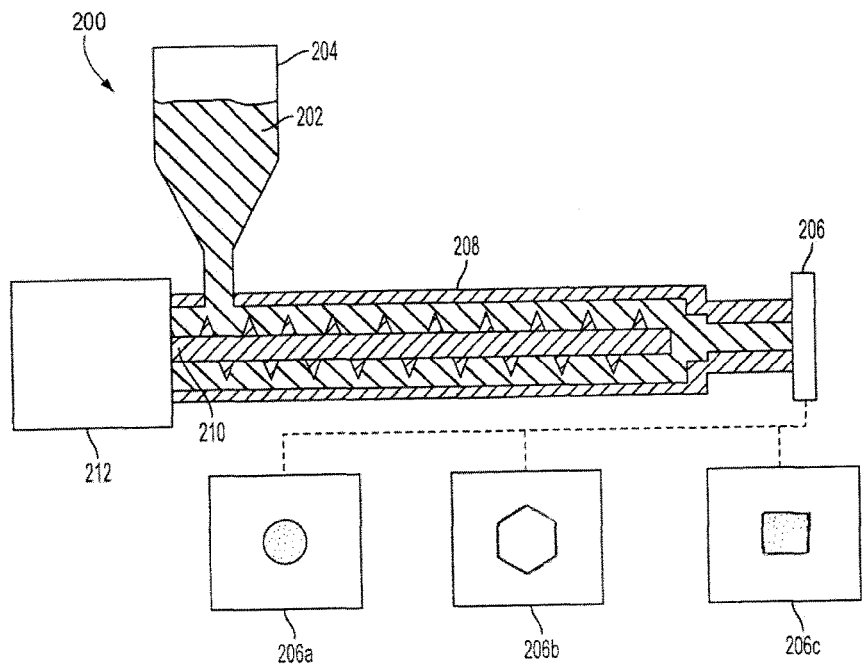

For example, in the press 200 shown in FIG. 5, nanostructured carbon 202 may be placed in a hopper 204 configured to feed material through an extrusion die 206. The press 200 includes an extrusion barrel 208 with a screw mechanism 210 connected to a drive motor 212 to carry the nanostructured carbon 202 through the extrusion barrel 208 to the extrusion die 206. The extrusion barrel 208 may optionally include means for heating the nanostructured carbon 202 as the nanostructured carbon 202 passes through the extrusion barrel 208. The extrusion die 206 has an opening with a shape corresponding to the cross-sectional shape of a part to be formed in the press 200. Extrusion dies 206 may be interchangeable, depending on the shape of objects desired. Some possible shapes of extrusion dies 206a, 206b, 206c are shown. For example, the extrusion die 206 may have an opening shaped like a circle (206a), a regular polygon (206b), a square (206c), an irregular polygon, a rectangle, etc. Extrusion dies 206 can be structured to create objects of extruded CNTs of a variety of shapes and sizes: symmetrical or asymmetrical, small to large. The nanostructured carbon 202 may optionally be mixed with another material before or within the press 200.

Figure 6:
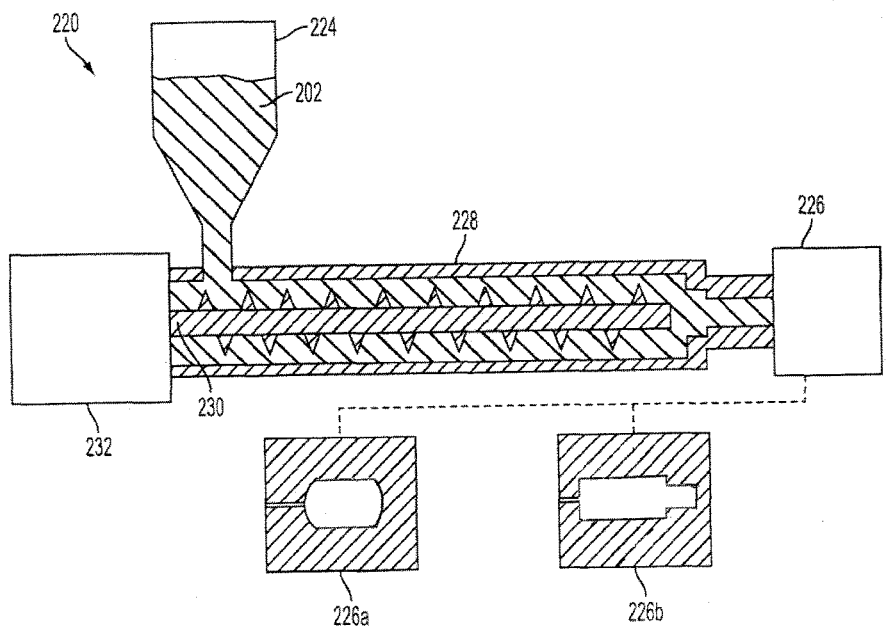

In some embodiments and as shown in the press 220 of FIG. 6, the nanostructured carbon 202 is placed into a hopper 224 configured to feed material to a mold 226. The press 220 includes a barrel 228 with a screw mechanism 230 connected to a drive motor 232 to carry the nanostructured carbon 202 through the barrel 228 to the mold 226. The barrel 228 may optionally include means for heating the nanostructured carbon 202 as the nanostructured carbon 202 passes through the barrel 228. The mold 226 has an opening with an interior shape corresponding to the exterior shape of a part to be formed in the press 220. Molds 226 may be interchangeable, depending on the shape of objects desired. Some possible shapes of molds 226a and 226b are shown. For example, the mold 226 may have shape of a rod or bar. The nanostructured carbon 202 may optionally be mixed with another material to form a paste or clay before or within the press 200 to improve flowability, mold release, or other process properties. Such materials may be subsequently removed by suitable means such as etching, pyrolysis, evaporation, etc. The resulting sintered object may be substantially free of the additional material, and may include essentially carbon and, in some embodiments, residual catalyst material.

In other embodiments and as shown in the press 240 of FIG. 7, the nanostructured carbon 202 is placed into a body 244 having an interior shape defining an exterior of a product to be formed. The nanostructured carbon 202 may be placed between two pistons 246, 248 surrounded by the body 244. The body 244 has walls 250 defining an interior cavity and configured to allow the pistons 246, 248 to slide freely. In other embodiments, a single piston may be configured to press CNTs against a body.

In an embodiment as shown in the press 260 of FIG. 8, nanostructured carbon 202 is placed within a mold portion 262 having one or more surfaces corresponding to a shape of a product to be formed. One or more additional mold portions 264 are configured to press the nanostructured carbon 202 against the mold portion 262, when pressed by pistons 266, 268, as shown in FIG. 9. Together, the mold portions 262, 264 define the shape of the product to be formed.

Pressure is applied to the CNTs to form them into a cohesive "green" body. For example, the screw mechanisms 210, 230 shown in FIGS. 5 and 6 apply pressure to the nanostructured carbon 202 as the nanostructured carbon 202 passes through the presses 200, 220. Extrusion through a die 206 as shown in FIG. 5 may be continuous (theoretically producing an infinitely long product) or semi-continuous (producing many discrete pieces). Wires produced by pressing CNTs through a die 206 may have continuous electrical connections along the length thereof. Molding, as in the press 220 shown in FIG. 6, is the process of manufacturing by shaping pliable raw material (e.g., nanostructured carbon 202) using a rigid pattern (the mold 226). The nanostructured carbon 202 adopts the shape of the mold.

The pistons 266, 268 shown in FIGS. 8 and 9 are pressed toward the nanostructured carbon 202, forming the nanostructured carbon 202 into a green object 270. The resulting green object 270 formed may be held together by relatively weak forces, such that the green object 270 may easily be further shaped (e.g., machined, drilled, etc.), but still holds its shape when handled. The nanostructured carbon particles making up the green object 270 may be in physical contact with one or more other carbon particles or held together by the materials used in forming the paste or clay.

In some embodiments, heat is applied to green objects to link the nanostructured carbon particles together into a more cohesive body in which at least some of the adjacent nanostructured carbon particles form chemical bonds between one another. For example, the green object may be heated at a heating rate from about 1° C./min to about 50° C./min to a preselected sintering temperature such as at least 1,500° C., 1,800° C., 2,100° C., 2,400° C., 2,500° C., 2,700° C. or even to just below the sublimation temperature of carbon (approximately 3600° C.). Heating above about 400° C. in air or another oxygen-containing atmosphere may result in at least some oxidation of the nanostructured carbon (e.g., burning or conversion of the solid carbon to CO and $CO_2$). For this reason, the sintering is typically performed in an inert atmosphere or vacuum.

Pressure may also be applied concurrently with, before, or after heat is applied. For example, the green objects may be pressed at a pressure from about 10 to about 1000 MPa, such as at about 30 MPa, about 60 MPa, about 250 MPa, about 500 MPa, or about 750 MPa. The green objects may be subjected to a heated inert environment, such as helium or argon, in an annealing furnace.

In certain embodiments, green objects are sintered to link the nanostructured carbon together into a more cohesive body (i.e., a "sintered body"). Sintering (i.e., subjecting them to heat in an oxygen-free environment) creates bonds between the nanostructured carbon at points of contact. Sintering typically occurs in a non-oxidizing environment, such as a vacuum or inert atmosphere, so that the carbon nanotubes are not oxidized during the sintering. Sintering nanostructured carbon to induce chemical bonding at the contact surfaces may improve desirable material properties such as strength, toughness, impact resistance, electrical conductivity, or thermal conductivity in the solid structure product when compared to the green material. The nanostructured carbon may also be sintered in the presence of additional constituents, such as metals or ceramics to form composite structures, lubricants to aid processing, or binders (e.g., water, ethanol, polyvinyl alcohol, coal, tar pitch etc.). Materials may be introduced as powders, shavings, liquids, etc. Suitable metals may include, for example, iron, aluminum, titanium, antimony, Babbitt metals, etc. Suitable ceramics may include materials such as oxides (e.g., alumina, beryllia, ceria, zirconia, etc.), carbides, boride, nitrides, silicides, etc. In embodiments in which materials other than nanostructured carbon are present, bonding occurs between at least some of the nanostructured carbon, and the additional materials may become locked into a matrix of CNTs.

The nanostructured carbon in the sintered object have chemical bonds connecting one another. Chemical bonds, which are generally stronger than physical bonds, impart different properties on the collection of nanostructured carbon than physical bonds. That is, the sintered object may have higher strength, thermal conductivity, electrical conductivity, or other properties than the green object from which it was formed. Chemical bonds may also provide electrical contact between adjacent nanostructured carbon, allowing electrons to flow within the sintered body.

When single-wall CNTs are bonded to adjacent single-wall CNTs, holes or gaps may form on the surface of the CNTs as some of the carbon-carbon bonds break, thus modifying the mechanical and electrical properties of the single-wall CNTs. The sintered single-wall CNTs, however, may still typically outperform non-sintered single-wall CNTs in such properties as strength, toughness, impact resistance, electrical conductivity, and thermal conductivity. With multi-wall CNTs, typically only the wall of the outer tube is modified; the internal walls remain intact. Thus, using multi-walled and bi-modally sized CNTs in, for example, extrusion and molding processes, may yield solid structures with properties that, in many respects, exceed practical limitations of single-walled CNTs. In some embodiments, sintering may cause the formation of chemical bonds between an inner wall and an outer wall of a multi-wall CNT.

Sintering appears to cause chemical or physical bonds, such as covalent bonds, to form between the walls of adjacent CNTs at their contact points. That is, any given CNT may "cross-link" with an adjacent CNT at the physical point of contact of the two CNTs. Any given CNT having undergone sintering may be bonded to numerous other CNTs (single-wall CNTs, multi-wall CNTs, or both). This increases the strength of the resulting structure because the CNTs do not slide or slip at the bonding points, and increases electrical and thermal conductivity by providing a path for electrons and heat to flow. If some CNTs are in contact with at least two adjacent CNTs, a continuous network of CNTs may have high electrical and thermal conductivity. That is, CNTs in contact with one another in a cohesive body may provide an electrical and thermal path between at least two points on opposite surfaces of the body. Unsintered CNTs tend to slide with respect to each other and lack the chemical bonds that promote electrical and thermal conductivity. Because the bonding caused by sintering may occur at numerous sites in a mass of CNTs, the sintered body has significantly increased strength, toughness, impact resistance, and conductivity over unsintered agglomerations of CNTs.

Figure 10:
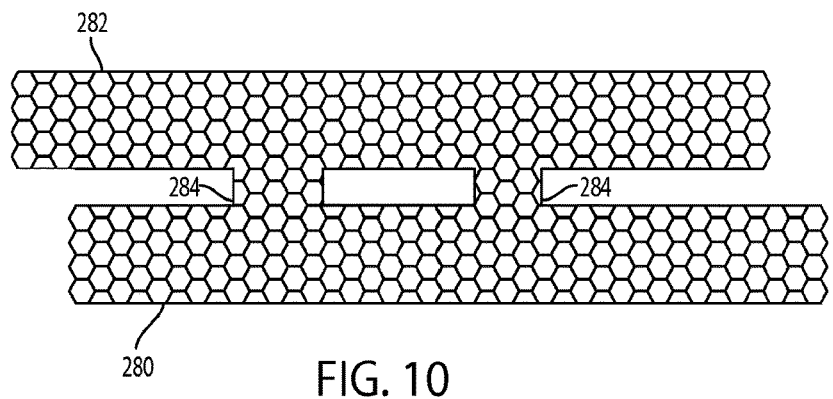
FIGS. 10 and 11 are simplified illustrations depicting structures of interconnected carbon nanotubes.

FIG. 10 schematically depicts the cross-linked structure of two bonded CNTs 280, 282 produced by a sintering process. When sintered, CNTs 280, 282 bond at their contact points 284. CNTs may form bonds with some or all of the other CNTs with which they are in contact during sintering. Due to the internal layering in a multi-wall CNT, bonding between the individual walls of the multi-wall CNT is likely to occur under sintering conditions. However, this bonding has not yet been confirmed in testing. The heating and optional pressurization of the CNTs in a sintering process are maintained until the desired level of cross-linking has occurred. The sintered CNTs are then cooled to a temperature at which the CNTs will not spontaneously react with oxygen. Thereafter, the mixture may be exposed to air for further processing, storage, packaging, shipment, sale, etc.

In another embodiment, a CNT mixture is heated in a reactive environment (e.g., in the presence of oxygen, hydrogen, a hydrocarbon, and/or another material). In this embodiment, heat and pressure are maintained as needed until the reactants in the reactive environment have reacted with one another or with the CNTs. The product is then cooled. In such a process, the reactants may form additional holes or pores in the CNTs, increasing the specific surface area of the sintered body. Alternatively, the reactants may deposit materials on the surface of the CNTs without affecting the underlying CNT structure.

In yet another embodiment, the CNT mixture is initially heated and sintered in a nonreactive environment (e.g., in a vacuum, in the presence of helium, or in the presence of argon). Subsequent to sintering, the heat and pressure are changed to suitable reaction conditions and reactants are added to the environment. Such reactants may include a variety of metals (as liquid or vapor), metal carbonyls, silane, or hydrocarbons. The reaction of the reactants with one another or with the carbon of the CNT may fill some or all of the interstices of the CNT lattice with products of the reactions. Such processing with additional reactants may in some cases be conducted during sintering, but may also be performed separately. The heat and pressure are maintained until the desired level of reaction (both cross-linking within the CNTs, and the reaction between the CNTs and the reactant) has occurred. The reacted mixture is then cooled and removed from the reaction environment for further processing, storage, packaging, shipment, sale, etc.

Figure 11:
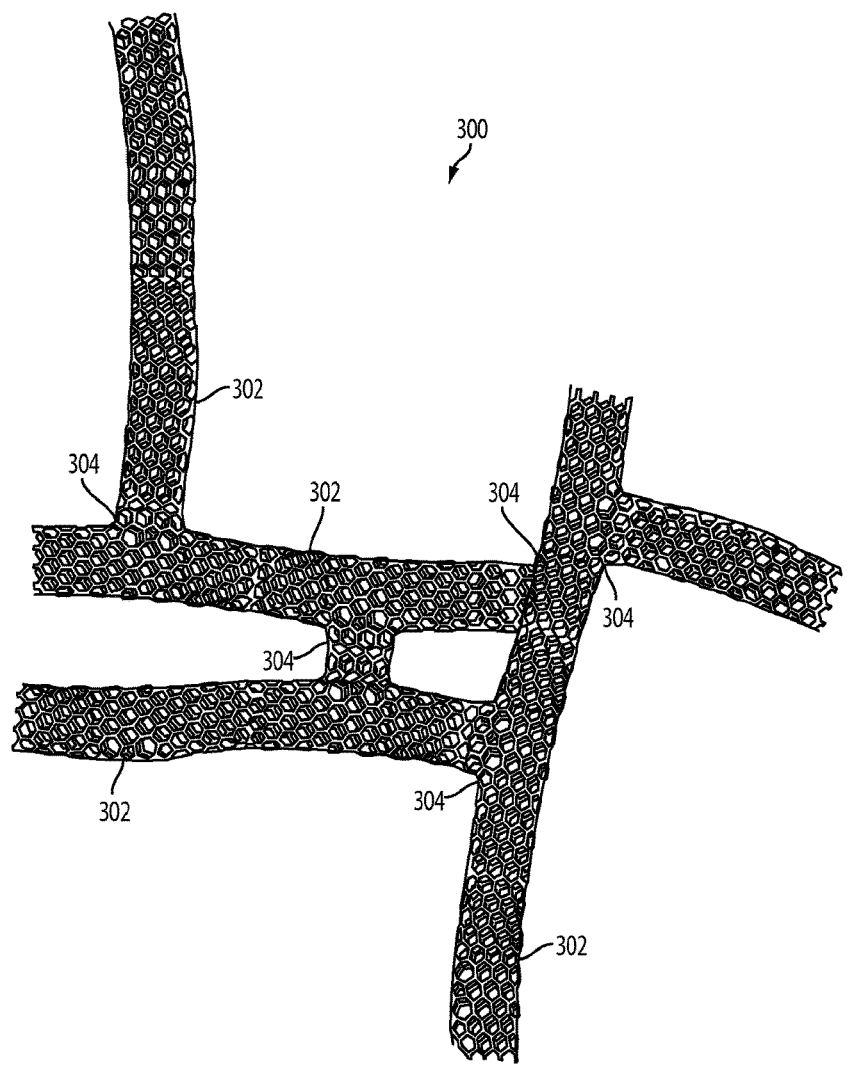

FIG. 11 schematically depicts a mass 300 of bonded CNTs 302. The CNTs 302 bind through sintering with other CNTs 302 (multi-wall or single-wall CNTs) through mutual contact points 304, binding the aggregate together into a highly cross-linked structure. The resultant binding may create a material of significant strength, toughness, impact resistance, and electrical and thermal conductivity.

During the sintering process, the green object may shrink, corresponding with a decrease in the size of voids among the CNTs. However, the sintered body may remain porous due to the porosity of the CNTs (i.e., holes in the center of CNTs) and due to voids between and among CNTs. The sintered body may have pores or voids having a median minimum dimension of less than about 1 µm, less than about 500 nm, less than about 100 nm, less than about 50 nm, or even less than about 10 nm. That is, voids may have two or more dimensions (e.g., a length, a width, and a height, each perpendicular to the others, or a diameter and a length), measured in different directions. The voids need not be regularly shaped. The "minimum dimension" is defined as the minimum of the two or more dimensions of a single void. The "median minimum dimension" is defined as the median of these minimum dimensions for a group of voids (e.g., voids visible under magnification in a cross section of the body).

A sintered body as described herein may have a high specific surface area, due to voids between CNTs and within CNTs (i.e., because the CNTs are hollow). For example, a sintered body may have a specific surface area of at least about 100 $m^2/g$, at least about 500 $m^2/g$, at least about 750 $m^2/g$, at least about 900 $m^2/g$, or even at least about 1000 $m^2/g$. The specific surface area can be controlled by the characteristic diameters or mixture of diameters of the CNTs used in forming the body. For example, small-diameter single-wall CNTs have specific surface areas up to approximately 3000 $m^2/g$, while large-diameter multi-wall CNTs have specific surface areas of approximately 100 $m^2/g$.

A sintered body made of CNTs may have a high electrical conductivity. For example, a sintered body may have an electrical conductivity of at least about $1 \times 10^5$ S/m (Siemens per meter), at least about $1 \times 10^6$ S/m, at least about $1 \times 10^7$ S/m, or even at least about $1 \times 10^8$ S/m. The electrical conductivity can be controlled by selecting the types of CNTs used to form the body, the chirality of the CNTs, the sintering conditions, and the quantity of resulting bonds in the sintered object. For example, single-wall CNTs with a metallic chirality have a much higher electrical conductivity than multi-wall CNTs. As a further example, an increase in the number of bonds appears to correlate with an increase in conductivity.

A sintered object may also have a high thermal conductivity. For example, a sintered body may have a thermal conductivity of at least about 400 W/m·K (watts per meter per Kelvin), at least about 1000 W/m·K, at least about 2000 W/m·K, or even at least about 4000 W/m·K. The thermal conductivity of the resulting sintered object may be controlled by selecting the types of CNTs used, the chirality of CNTs used and the methods of processing and sintering. For example, single-wall CNTs with a metallic chirality have much high thermal conductivity than large multi-wall CNTs.

CNTs may alternatively be pressed after the sintering process by, for example, extrusion or molding as described above with respect to FIGS. 5 through 9. In some embodiments, the sintering process may be part of the formation of the desired object. For example, a section of the extrusion barrel may heat the CNTs to the sintering temperature in an inert atmosphere for an appropriate amount of time to cause sintering. Such heating may be, for example, induction heating or plasma arc heating. Thus, sintered objects may be continuously extruded.

The nanostructured carbon may optionally be mixed with another material such as a metal, a ceramic, or glass. The resulting material may be pressed or pulled through a die under extreme heat or cold. The material, forced into a given shape, is held in place for a period of time and at sintering temperatures and pressures, and then returned to normal atmospheric conditions. The products may be continuous, such as wires, or may be discrete pieces, such as bars, rods, etc. Molding of CNTs typically involves either using the CNT material in concentrated form (i.e., with minimal impurities) or in forming a moldable composite paste or clay, with another material, such as a metal. The moldable material is placed or poured into a rigid mold, held at a particular temperature and pressure, and then cooled back to normal atmospheric conditions.

In some embodiments, an incremental manufacturing method may be employed wherein nanostructured carbon (either compressed or not) are placed in a nonreactive environment, such as in an inert gas autoclave. The nanostructured carbons are sintered to form bonds between the nanostructured carbons in the surface layer and the nanostructured carbons in an underlying layer. For example, a laser may irradiate a portion of the nanostructured carbons in a pattern. Additional nanostructured carbons are deposited over the sintered nanostructured carbons, and in turn sintered. The sintering process is repeated as many times as necessary to achieve a selected thickness of sintered nanostructured carbons. The sintered nanostructured carbons are then cooled to a temperature below which the nanostructured carbons do not react with oxygen or other atmospheric gases. The sintered nanostructured carbons may then be removed from the nonreactive environment without contaminating the sintered nanostructured carbons. In some embodiments, the sintered nanostructured carbons are cooled and removed from the nonreactive environment before deposition of additional portion of nanostructured carbons.

In some embodiments, sintered objects are further treated by electrodeposition or electroplating to fill interstices in the sintered objects with another material. A solution having materials to be deposited is prepared. The solvent of the solution may be water, an organic solvent, or an inorganic solvent. The solute may include a material such as a metal salt, an organic salt, a metalorganic salt, etc. Electroplating solutions are known in the art and not described in detail herein. The sintered object to be treated is contacted with the solution, such as by immersing the body in the solution. An electric potential (a direct-current voltage or an alternating-current voltage) is applied to the body to induce electrodeposition of one or more components of the solution. The composition, potential, temperature, and/or pressure are maintained until a selected amount of the material is deposited onto the sintered object. The sintered object is then removed from the solution and rinsed to remove excess solution. Electrodeposition may be used to alter properties of the sintered objects (e.g., electrical or thermal conductivity).

Sintered objects formed as described herein include a plurality of cross-linked nanostructured carbons. The nanostructured carbons define a plurality of voids, which may have a median minimum dimension of less than about 1 µm, less than about 500 nm, less than about 100 nm, less than about 50 nm, or even less than about 10 nm. Some or all of the nanostructured carbon may include a metal, such as a metal particle from which the nanostructured carbon was formed, or a metal coating subsequently placed on the nanostructured carbon. The sintered objects may be electrically conductive members, such as electrodes, wires, contacts, etc. The sintered object may include another material dispersed in a continuous matrix surrounding and in contact with the nanostructured carbon. The sintered objects may have improved strength, toughness, impact resistance, and electrical and thermal conductivity in comparison to conventional materials.

In some embodiments, the sintered objects also include other morphologies of carbon. For example, graphene, graphite, and nanodiamonds may be sintered to form an interconnected graphene and graphite matrix which retains the nanodiamonds. As another example, a lattice of sintered CNTs may contain nanodiamonds.

Both the compressed sintered objects and the sintered objects described herein have a wide variety of potentially useful applications. Electrical properties of sintered objects may be beneficial in various applications. For example, sintered objects of CNTs may have high conductivities and high specific surface areas, and may be used as electrodes. High-conductivity electrodes may be used to produce more efficient batteries, electric-arc furnace electrodes for metallurgical applications, capacitors, ultra-capacitors, power-conversion devices, computer circuits, etc.

Figure 12:
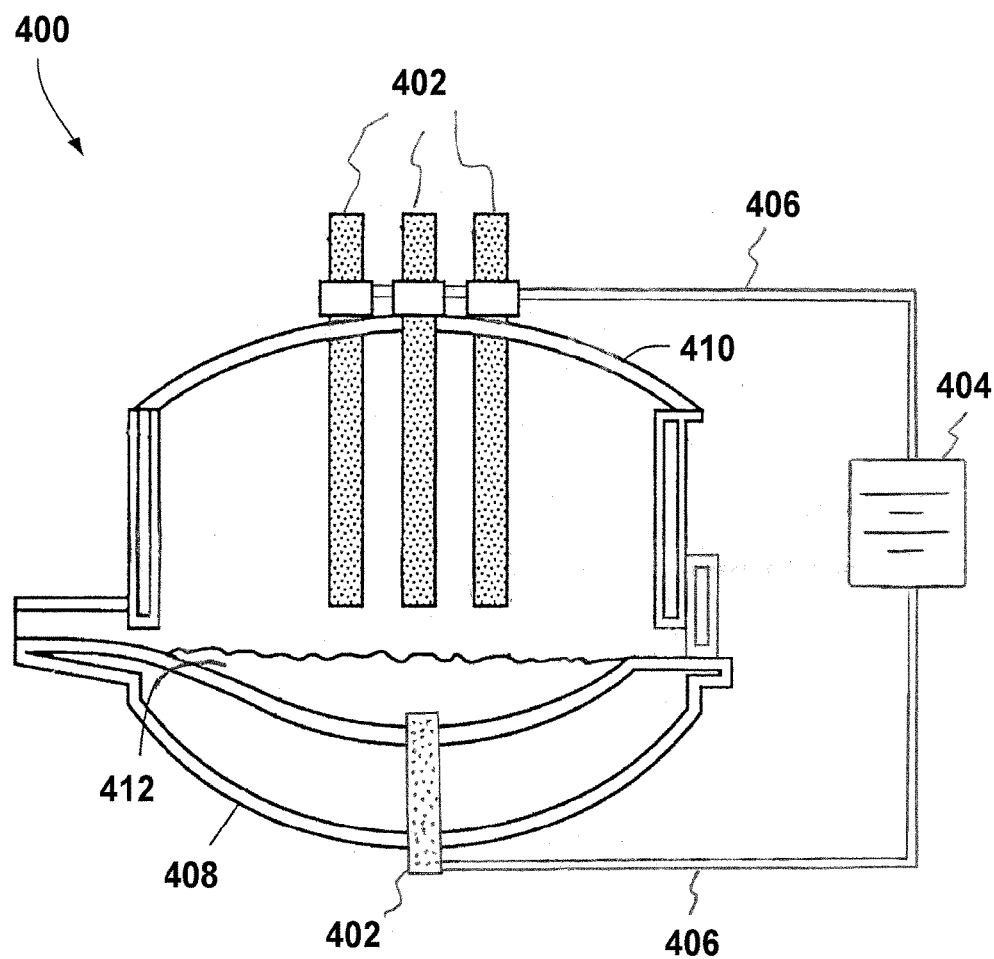
FIG. 12 is a simplified cross-sectional view of an electric arc furnace having electrodes including interconnected carbon nanotubes.

For example, FIG. 12 shows a simplified cross-sectional view of an electric arc furnace 400. In the electric arc furnace 400, one or more electrodes 402 each include sintered objects as described above, having a network of compressed, interconnected CNTs. The interconnections in the network may increase the electrical and thermal conductivity of the electrodes 402, and the electrodes 402 may therefore be more efficient at transferring electrical current and more durable than conventional electrodes. CNTs in the electrodes 402 may be in electrical contact with other CNTs, providing a continuous path for electrons to travel within the electrodes 402. The CNTs in the electrodes 402 may include CNTs having metallic properties.

The electrodes 402 are configured to be connected to an electrical source 404, such as by wires or leads 406. The electrodes 402 may be designed to deliver current to the electric arc furnace 400.

The electric arc furnace 400 shown in FIG. 12 includes a lower body 408, which may be an insulated bowl or hearth. The electric arc furnace 400 also includes a cover 410. The electrical source 404 provides an electric potential across the electrodes 402 and into the electric arc furnace 400. The electrical source 404 may be an alternating-current source or a direct-current source. The electric arc furnace 400 contains a material 412 to which an electrical current is to be applied, such as a metal to be melted or purified. The electrodes 402 may be disposed within openings in the electric arc furnace 400, such as in the cover 410 and the lower body 408. The electric arc furnace 400 is shown as having three electrodes 402 through the cover 410 and one electrode 402 through the lower body 408, but may include any number and configuration of electrodes 402, such as one, two, three, four, five, etc. In operation, the electrical source 404 delivers a current to the electrodes 402 within openings in the cover 410. The current arcs across a gap between these electrodes 402 and the material 412, which heats the material 412. The current travels through one or more electrodes 402 through the lower body 408 to complete the circuit back to the electrical source 404. Arcing heats the material 412 to its melting point or higher, after which the material 412 or a portion thereof may be transferred from the electric arc furnace 400 for further processing. Electric arc furnaces are described in more detail in, for example, U.S. Pat. No. 5,572,544, issued Nov. 5, 1996, and titled "Electric Arc Furnace Post Combustion Method."

Figure 13:
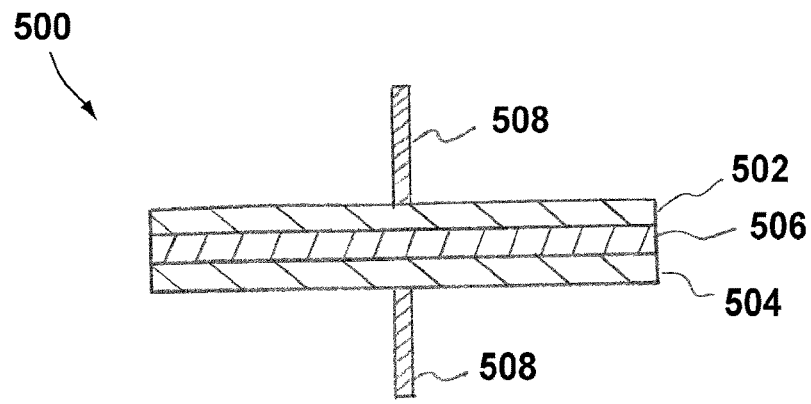
FIG. 13 is a simplified cross-sectional view of a capacitor having electrodes including interconnected carbon nanotubes.

Electrodes having a network of compressed, interconnected nanostructured carbon may be used in capacitors. Capacitors contain at least two electrodes separated by an insulator, and are widely used in electrical circuits. Capacitors can be used for energy storage, power conditioning, motor starters, signal processing, etc. FIG. 13 shows a simplified cross-sectional view of a capacitor 500 having electrodes 502, 504. For example, one or both of the electrodes 502, 504 may include a network of compressed, interconnected CNTs, as described above. The electrodes 502, 504 are separated by a dielectric 506. The dielectric 506 may be an insulating material, such as a polymer, but the electrodes 502, 504 may alternatively be separated by air or a vacuum. When a voltage is applied via leads 508 across the electrodes 502, 504, a static electric field develops across the dielectric 506, causing positive charge to collect on one electrode 502 and negative charge to collect on the other electrode 504. Energy is stored in the electric field. Capacitors are described in more detail in, for example, U.S. Pat. No. 2,800,616, issued Apr. 14, 1954, and titled "Low Voltage Electrolytic Capacitor."

Figure 14:
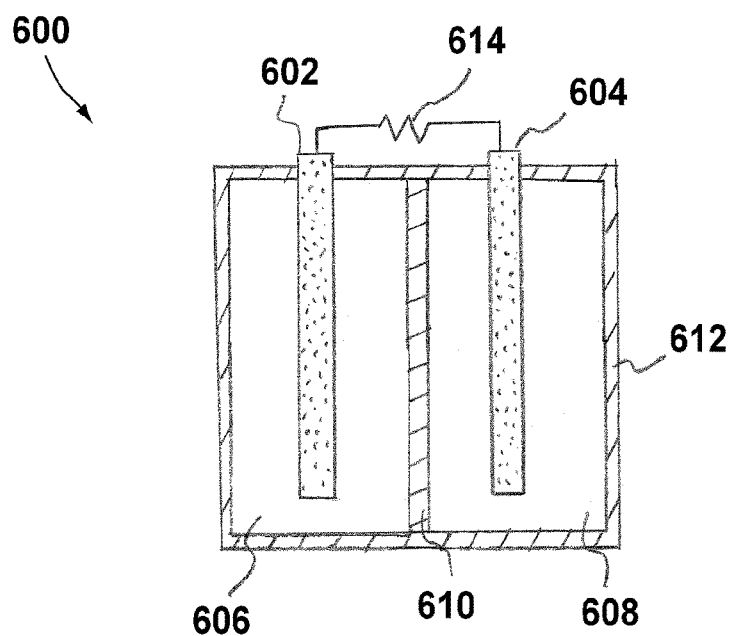
FIG. 14 is a simplified cross-sectional view of an electrochemical battery having electrodes including interconnected carbon nanotubes.

Electrodes having a network of compressed, interconnected nanostructured carbon may also be used in batteries. FIG. 14 shows a simplified cross-sectional view of an electrochemical battery 600 (i.e., a voltaic cell). For example, in the battery 600, one or both of electrodes 602, 604 include a network of compressed, interconnected CNTs, as described above. The electrodes 602, 604 are each in contact with electrolytes 606, 608. The electrolytes 606, 608 are separated by a salt bridge 610 inside a case 612. When a load 614 (represented schematically by a resistor) is connected across the electrodes 602, 604, current flows through the load 614 via the electrodes 602, 604. Electrochemical batteries are described in more detail in, for example, U.S. Pat. No. 5,187,030, issued Feb. 16, 1991, and titled "Electrochemical Battery Having High Energy Per Unit Mass."

Figure 15:
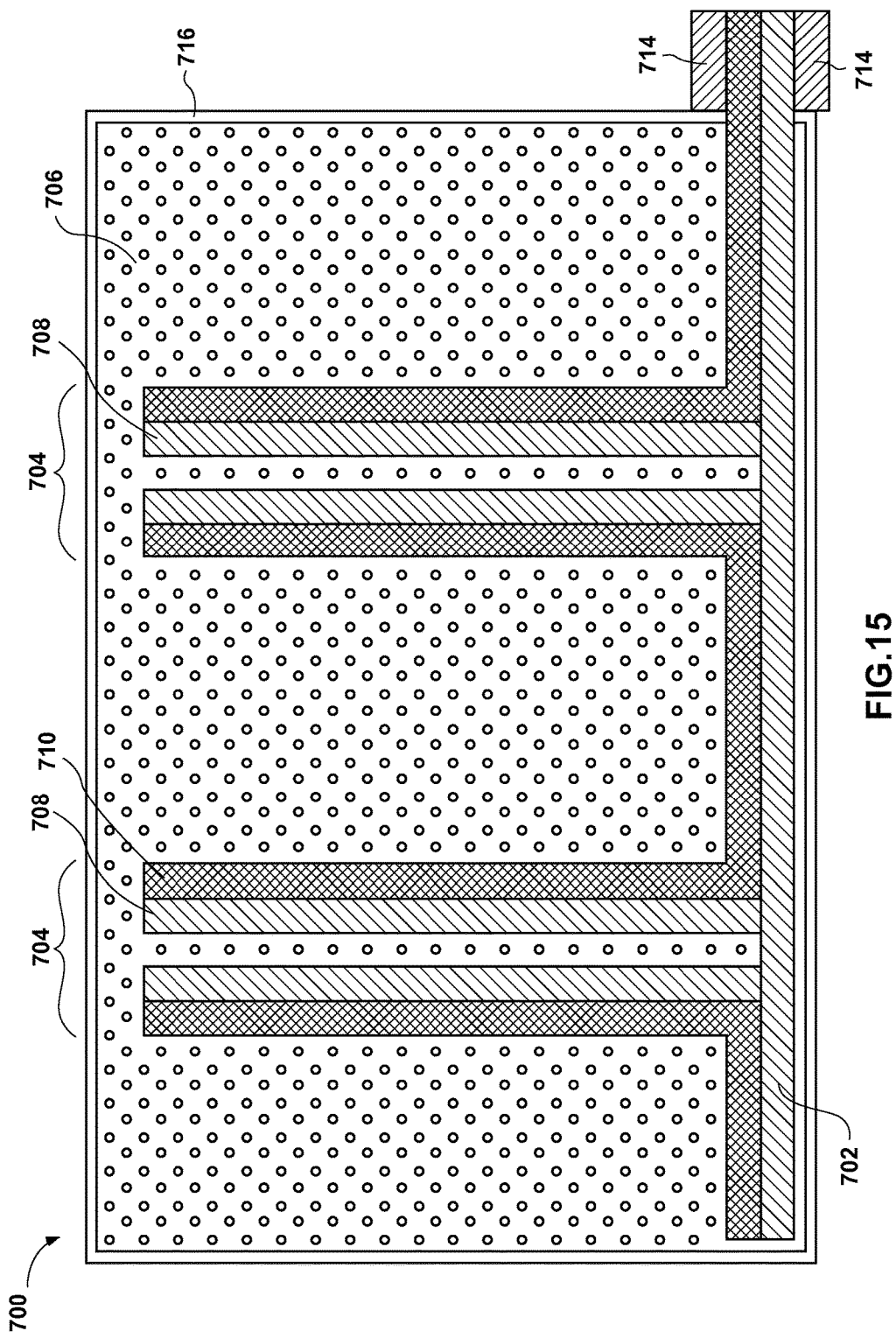
FIG. 15 is a simplified cross-sectional view of a nuclear battery having electrodes including interconnected carbon nanotubes.

FIG. 15 shows a nuclear battery 700 having a semiconductor substrate 702 with Schottky barrier arrays 704 and a radioactive source 706. The radioactive source 706 provides alpha, beta, and/or gamma radiation from a radioisotope. The radioactive source 706 has a material including at least one radionuclide, such as tritium (hydrogen-3), beryllium-10, carbon-14, silicon-32, phosphorous-32, cobalt-60, krypton-85, strontium-90, cesium-137, promethium-147, americium-241, radium-226, lead-210, polonium-210, radium-228, actinium-227, thorium-228, uranium-234, uranium-235, curium-242, curium-244, and mixtures thereof.

The Schottky barrier arrays 704 include semiconductors 708 and a metallic coating 710 over at least a portion of the semiconductors 708. The semiconductors 708 may be cylinders, plates, or any other shape. Schottky barriers between the metallic coating 710 and the semiconductors 708 act as diodes to allow current to flow primarily or entirely in one direction. Schottky barriers are described in, for example, U.S. Pat. No. 6,855,593, issued Feb. 15, 2005, and titled "Trench Schottky Barrier Diode." For example, current may flow from the semiconductors 708 to the metallic coating 710. The nuclear battery 700 includes terminals 714 to which a load may be connected. The terminals 714 may be electrodes including a network of compressed, interconnected CNTs, as described above. One of the terminals 714 is connected to the semiconductor substrate 702, and the other is connected to the metallic coating 710. A container 716 optionally encloses the substrate 702, the nanofiber Schottky barrier array 704, the radioactive source 706, and/or the terminals 714. The Schottky barrier arrays 704 may optionally include CNTs or other nanofibers (i.e., the semiconductor cylinders 708 may be CNTs), and the radioactive source 706 may be at least partially disposed within interstices thereof. Nuclear batteries in which the Schottky barrier arrays 704 include nanofibers are described in U.S. Patent Publication 2014/0021827 A1, previously incorporated herein by reference.

What is claimed is:

1. A method of producing a sintered object, comprising:
    mixing a mass of nanostructured carbon particles with at least one fluid containing a dissolved carbon source to produce a paste;
    pyrolyzing the paste such that the dissolved carbon source forms residual solid carbon within a cohesive body of the nanostructured carbon particles; and
    sintering the cohesive body of the nanostructured carbon particles with the residual solid carbon at a pressure from about 10 MPa to about 1000 MPa to form contacts between adjacent nanostructured carbon particles to provide an electrical path between at least two remote points of the cohesive body.

2. The method of claim 1, wherein sintering the cohesive body comprises sintering in an inert atmosphere or in a vacuum.

3. The method of claim 1, wherein the mass of nanostructured carbon particles comprises carbon nanotubes.

4. The method of claim 3, wherein the carbon nanotubes have metallic properties.

5. The method of claim 3, wherein the carbon nanotubes have a multi-modal distribution of outer diameters.

6. The method of claim 1, further comprising forming covalent bonds between at least some of the adjacent nanostructured carbon particles.

7. The method of claim 1, further comprising disposing the mass of nanostructured carbon particles between opposing dies in a press.

8. The method of claim 1, wherein sintering the cohesive body of the nanostructured carbon particles with the residual solid carbon comprises sintering a plurality of unfluorinated nanostructured carbon particles.

9. The method of claim 1, further comprising reducing carbon oxides with a reducing agent in the presence of a catalyst to form the nanostructured carbon particles, wherein the nanostructured carbon particles comprise a plurality of carbon nanotubes.

10. The method of claim 1, further comprising selecting nanostructured carbon particles comprising a mixture of carbon nanotubes, wherein the mixture of carbon nanotubes comprises:
    at least one material selected from the group consisting of multi-wall carbon nanotubes and carbon nanofibers with diameters greater than about 30 nm; and
    at least one material selected from the group consisting of single-wall, double-wall, and triple-wall carbon nanotubes with diameters less than about 20 nm.

11. The method of claim 1, wherein mixing a mass of nanostructured carbon particles with at least one fluid containing a dissolved carbon source comprises mixing a mass of carbon nanofibers with at least one fluid containing a dissolved carbon source.

12. The method of claim 1, further comprising mixing the mass of nanostructured carbon particles with at least one material selected from the group consisting of metal, ceramic, and glass.

13. The method of claim 1, further comprising;
adding a surface layer of nanostructured carbon particles to the cohesive body of nanostructured carbon particles; and
sintering the surface layer of nanostructured carbon particles to form bonds between the surface layer of nanostructured carbon particles and the cohesive body of nanostructured carbon particles.

14. The method of claim 13, further comprising forming a pattern of sintered nanostructured carbon particles adjacent to non-sintered nanostructured carbon particles in the cohesive body of nanostructured carbon particles.

15. The method of claim 14, wherein forming a pattern of sintered nanostructured carbon particles comprises irradiating a portion of the nanostructured carbon particles.

16. The method of claim 1, further comprising extruding the paste through a die to form a green object before pyrolizing the paste.

17. The method of claim 1, wherein sintering the cohesive body comprises exposing the cohesive body to a temperature of at least 1,000° C.

18. A method of producing a sintered object, comprising:
mixing a mass of nanostructured carbon particles with at least one fluid;
mixing the nanostructured carbon particles and the at least one fluid with a sugar solution to form a paste;
extruding the paste to form a green object;
heating the green object to pyrolyze the sugar; and
further heating the green object to a temperature of at least 1,000° C. and a pressure from about 10 MPa to about 1,000 MPa to form a cohesive body having contacts between adjacent nanostructured carbon particles and to provide an electrical path between at least two remote points of the cohesive body.

* * * * *